(12) United States Patent
Belbey et al.

(10) Patent No.: US 9,864,211 B2
(45) Date of Patent: Jan. 9, 2018

(54) SYSTEMS AND METHODS FOR REMOVABLY COUPLING AN ELECTRONIC DEVICE TO EYEWEAR

(71) Applicant: OAKLEY, INC., Foothill Ranch, CA (US)

(72) Inventors: Jason Belbey, Fullerton, CA (US); Hans Karsten Moritz, Foothill Ranch, CA (US); Myong Kim, Orange, CA (US)

(73) Assignee: Oakley, Inc., Foothill Ranch, CA (US)

( * ) Notice: Subject to any disclaimer, the term of this patent is extended or adjusted under 35 U.S.C. 154(b) by 109 days.

(21) Appl. No.: 13/767,778

(22) Filed: Feb. 14, 2013

(65) Prior Publication Data
US 2013/0250232 A1    Sep. 26, 2013

Related U.S. Application Data

(60) Provisional application No. 61/600,563, filed on Feb. 17, 2012, provisional application No. 61/741,796, (Continued)

(51) Int. Cl.
*G02C 7/02* (2006.01)
*G02C 11/00* (2006.01)
(Continued)

(52) U.S. Cl.
CPC ............. *G02C 7/02* (2013.01); *G02C 11/00* (2013.01); *G02C 11/04* (2013.01); *G02C 11/10* (2013.01);
(Continued)

(58) Field of Classification Search
CPC G02B 27/0103; G02B 23/18; G02B 27/0149; G02C 9/04; G02C 5/143;
(Continued)

(56) References Cited

U.S. PATENT DOCUMENTS

| 2,237,567 A | 4/1941 | Land |
| 2,482,195 A | 9/1949 | Martin |

(Continued)

FOREIGN PATENT DOCUMENTS

| CA | 2 307 869 | 4/2000 |
| CN | 1234895 A | 11/1999 |

(Continued)

OTHER PUBLICATIONS

Complaint for Patent and Tradedress Infringement; U.S. District Court—Central District of California; Case No. SA-CV-07-1184 AHS (Anx); *Oakley, Inc.* v. *Audio Visual Allstar dba AVAsunglasses. com*; Filed Oct. 4, 2007; this lawsuit is settled and dismissed.

(Continued)

*Primary Examiner* — Jie Lei
(74) *Attorney, Agent, or Firm* — Sterne, Kessler, Goldstein & Fox P.L.L.C.

(57) ABSTRACT

This disclosure provides systems and methods for removably coupling an electronic device to eyewear. In one aspect, an eyeglass is provided. The eyeglass includes an eyeglass frame adapted to be carried by a head of a wearer, at least a first lens, and at least a first lens support portion of the eyeglass frame configured to position the at least first lens in a path of a field of view of a wearer. The eyeglass further includes an attachment device that comprises a first connector and a second connector, where the first connector removably couples the attachment device to the eyeglass frame, and an electronic device, where the second connector removably couples the electronic device to the attachment device.

30 Claims, 37 Drawing Sheets

Related U.S. Application Data filed on Feb. 20, 2012, provisional application No. 61/601,551, filed on Feb. 21, 2012.

(51) Int. Cl.
*G02C 11/04* (2006.01)
*H05K 7/12* (2006.01)
*H05K 13/00* (2006.01)

(52) U.S. Cl.
CPC .............. *H05K 7/12* (2013.01); *H05K 13/00* (2013.01); *G02C 2200/02* (2013.01); *Y10T 29/49002* (2015.01); *Y10T 29/49826* (2015.01)

(58) Field of Classification Search
CPC ... G02C 7/02; G02C 7/04; G02C 7/08; G02C 5/00; G02C 7/16; G02C 11/10; G02C 11/04; G02C 11/00; G02C 2200/02; A42B 1/066; A42B 3/04; A42B 3/228; H05K 7/12; H05K 13/00; Y10T 29/49826; Y10T 29/49002
USPC ..... 359/13, 407, 632; 351/158, 123, 169.01, 351/159.7, 159.73, 159.39, 178; 2/6.1–6.5, 13, 422, 426, 444, 448, 2/450–452
See application file for complete search history.

(56) References Cited

U.S. PATENT DOCUMENTS

| | | |
|---|---|---|
| 3,247,330 A | 4/1966 | Hinman |
| 3,588,384 A | 6/1971 | Negley |
| 3,665,122 A | 5/1972 | Weiss |
| 3,809,829 A | 5/1974 | Vignini et al. |
| 3,883,701 A | 5/1975 | Delorenzo |
| 3,957,184 A | 5/1976 | Shurman |
| 4,247,178 A | 1/1981 | Cook |
| 4,516,157 A | 5/1985 | Campbell |
| 4,550,984 A | 11/1985 | Reymond |
| 4,593,683 A | 6/1986 | Blaha |
| D287,021 S | 12/1986 | Johnson |
| 4,683,587 A | 7/1987 | Silverman |
| 4,712,244 A | 12/1987 | Zwicker et al. |
| 4,773,095 A | 9/1988 | Zwicker et al. |
| 4,803,487 A | 2/1989 | Willard et al. |
| 4,806,008 A | 2/1989 | Tarloff |
| 4,806,011 A | 2/1989 | Bettinger |
| 4,856,086 A | 8/1989 | McCullough |
| 4,877,320 A | 10/1989 | Holden |
| 4,882,769 A | 11/1989 | Gallimore |
| 4,904,078 A | 2/1990 | Gorike |
| 4,944,583 A | 7/1990 | Jennings |
| 5,020,150 A | 5/1991 | Shannon |
| 5,029,216 A | 7/1991 | Jhabvala et al. |
| 5,050,150 A | 9/1991 | Ikeda |
| 5,159,639 A | 10/1992 | Shannon et al. |
| 5,185,620 A | 2/1993 | Cooper |
| 5,281,957 A | 1/1994 | Schoolman |
| 5,307,204 A | 4/1994 | Dor |
| 5,327,178 A | 7/1994 | McManigal |
| 5,335,285 A | 8/1994 | Gluz |
| 5,353,378 A | 10/1994 | Hoffman et al. |
| 5,367,345 A | 11/1994 | da Silva |
| 5,369,415 A | 11/1994 | Richard et al. |
| 5,381,114 A | 1/1995 | Pena-Finol et al. |
| 5,446,507 A | 8/1995 | Chang |
| 5,467,104 A | 11/1995 | Furness, III et al. |
| 5,483,691 A | 1/1996 | Heck et al. |
| 5,557,444 A | 9/1996 | Melville et al. |
| 5,563,951 A | 10/1996 | Wang et al. |
| 5,579,400 A | 11/1996 | Ballein |
| 5,581,492 A | 12/1996 | Janik |
| 5,583,584 A | 12/1996 | Friedman |
| 5,590,417 A | 12/1996 | Rydbeck |
| 5,596,339 A | 1/1997 | Furness, III et al. |
| 5,606,743 A | 2/1997 | Vogt et al. |
| 5,608,808 A | 3/1997 | da Silva |
| 5,613,222 A | 3/1997 | Guenther |
| 5,617,477 A | 4/1997 | Boyden |
| 5,634,201 A | 5/1997 | Mooring |
| 5,668,867 A | 9/1997 | Nagai |
| 5,680,465 A | 10/1997 | Boyden |
| 5,682,434 A | 10/1997 | Boyden |
| 5,694,475 A | 12/1997 | Boyden |
| 5,708,724 A | 1/1998 | Burris et al. |
| 5,715,323 A | 2/1998 | Walker |
| 5,717,479 A | 2/1998 | Rickards |
| 5,721,783 A | 2/1998 | Anderson |
| 5,737,436 A | 4/1998 | Boyden |
| 5,757,929 A | 5/1998 | Wang et al. |
| 5,777,715 A | 7/1998 | Kruegle et al. |
| H1790 H | 3/1999 | Coleman |
| 5,886,822 A | 3/1999 | Spitzer |
| 5,889,843 A | 3/1999 | Singer et al. |
| 5,924,868 A | 7/1999 | Rod |
| 5,953,434 A | 9/1999 | Boyden |
| 5,971,538 A | 10/1999 | Heffner |
| 5,973,728 A | 10/1999 | Levitan |
| 5,978,689 A | 11/1999 | Tuoriniemi et al. |
| 5,986,813 A | 11/1999 | Saikawa et al. |
| 5,995,592 A | 11/1999 | Shirai et al. |
| 6,010,216 A | 1/2000 | Jesiek |
| 6,012,812 A | 1/2000 | Rickards |
| 6,023,372 A | 2/2000 | Spitzer et al. |
| 6,084,556 A | 7/2000 | Zwern |
| 6,091,546 A | 7/2000 | Spitzer |
| 6,091,832 A | 7/2000 | Shurman et al. |
| D430,145 S | 8/2000 | Boyden et al. |
| 6,108,197 A | 8/2000 | Janik |
| 6,157,533 A | 12/2000 | Sallam et al. |
| 6,181,956 B1 | 1/2001 | Koskan |
| 6,192,253 B1 | 2/2001 | Charlier et al. |
| 6,204,974 B1 | 3/2001 | Spitzer |
| 6,211,799 B1 | 4/2001 | Post et al. |
| 6,212,414 B1 | 4/2001 | Alameh et al. |
| 6,218,958 B1 | 4/2001 | Eichstaedt et al. |
| D441,388 S | 5/2001 | Lightman |
| 6,225,897 B1 | 5/2001 | Doyle et al. |
| 6,230,327 B1 | 5/2001 | Briand et al. |
| 6,231,181 B1 | 5/2001 | Swab et al. |
| 6,233,344 B1 | 5/2001 | Clegg et al. |
| 6,243,578 B1 | 6/2001 | Koike |
| 6,252,970 B1 | 6/2001 | Poon et al. |
| D445,416 S | 7/2001 | Glezerman |
| 6,272,359 B1 | 8/2001 | Kivelä et al. |
| 6,285,757 B1 | 9/2001 | Carroll et al. |
| 6,292,213 B1 | 9/2001 | Jones |
| 6,301,050 B1 | 10/2001 | DeLeon |
| 6,301,367 B1 | 10/2001 | Boyden et al. |
| 6,301,593 B1 | 10/2001 | Toyosato |
| 6,307,526 B1 | 10/2001 | Mann |
| 6,344,727 B1 | 2/2002 | Desai et al. |
| 6,349,001 B1 | 2/2002 | Spitzer |
| 6,350,129 B1 | 2/2002 | Gorlick |
| 6,353,503 B1 | 3/2002 | Spitzer et al. |
| 6,356,392 B1 | 3/2002 | Spitzer |
| 6,374,177 B1 | 4/2002 | Lee et al. |
| 6,381,484 B1 | 4/2002 | Ayanruoh |
| 6,384,982 B1 | 5/2002 | Spitzer |
| 6,392,798 B1 | 5/2002 | Newkirk |
| 6,417,969 B1 | 7/2002 | DeLuca et al. |
| 6,421,031 B1 | 7/2002 | Ronzani et al. |
| 6,424,820 B1 | 7/2002 | Burdick et al. |
| 6,442,018 B1 | 8/2002 | Dinkin |
| D462,946 S | 9/2002 | Beraut et al. |
| 6,445,805 B1 | 9/2002 | Grugel |
| 6,456,721 B1 | 9/2002 | Fukuda |
| 6,476,815 B1 | 11/2002 | Ando |
| 6,483,483 B2 | 11/2002 | Kosugi et al. |
| 6,490,362 B1 | 12/2002 | Clegg et al. |
| 6,493,136 B2 | 12/2002 | Chang et al. |
| 6,510,325 B1 | 1/2003 | Mack, II et al. |
| 6,519,475 B1 | 2/2003 | Kim |

(56) References Cited

U.S. PATENT DOCUMENTS

| | | |
|---|---|---|
| 6,523,006 B1 | 2/2003 | Ellis et al. |
| 6,529,804 B1 | 3/2003 | Draggon et al. |
| 6,540,347 B1 | 4/2003 | Radziwon et al. |
| 6,542,081 B2 | 4/2003 | Torch |
| 6,546,101 B1 | 4/2003 | Murray et al. |
| 6,549,122 B2 | 4/2003 | Depta |
| 6,549,231 B1 | 4/2003 | Matsui |
| 6,554,763 B1 | 4/2003 | Amano et al. |
| 6,560,029 B1 | 5/2003 | Dobbie et al. |
| 6,564,047 B1 | 5/2003 | Steele et al. |
| 6,567,651 B2 | 5/2003 | Whitley |
| 6,580,405 B1 | 6/2003 | Yamazaki et al. |
| 6,582,075 B1 | 6/2003 | Swab et al. |
| 6,618,099 B1 | 9/2003 | Spitzer |
| 6,629,076 B1 | 9/2003 | Haken |
| 6,639,706 B2 | 10/2003 | Ziv et al. |
| 6,657,673 B2 | 12/2003 | Ishikawa |
| 6,687,486 B2 | 2/2004 | Grzeczkowski |
| 6,691,028 B2 | 2/2004 | Bullock et al. |
| 6,717,533 B2 | 4/2004 | Seaberg et al. |
| 6,724,354 B1 | 4/2004 | Spitzer et al. |
| 6,725,022 B1 | 4/2004 | Clayton et al. |
| 6,728,531 B1 | 4/2004 | Lee et al. |
| 6,729,726 B2 | 5/2004 | Miller et al. |
| 6,735,435 B2 | 5/2004 | Newell et al. |
| 6,736,759 B1 | 5/2004 | Stubbs et al. |
| 6,739,873 B1 | 5/2004 | Rod et al. |
| 6,763,119 B2 | 7/2004 | Lee |
| 6,766,182 B2 | 7/2004 | Janninck et al. |
| 6,769,767 B2 | 8/2004 | Swab et al. |
| 6,783,501 B2 | 8/2004 | Takahashi et al. |
| 6,871,951 B2 | 3/2005 | Blum et al. |
| 6,885,848 B2 | 4/2005 | Lee |
| 6,911,172 B2 | 6/2005 | Swab et al. |
| 6,912,386 B1 | 6/2005 | Himberg et al. |
| 6,920,283 B2 | 7/2005 | Goldstein |
| 6,929,365 B2 | 8/2005 | Swab et al. |
| 6,941,248 B2 | 9/2005 | Friedrich et al. |
| 6,957,890 B2 | 10/2005 | Shapiro |
| 6,990,082 B1 | 1/2006 | Zehavi et al. |
| 7,013,009 B2 | 3/2006 | Warren |
| 7,023,621 B2 | 4/2006 | Dietrich |
| 7,031,483 B2 | 4/2006 | Boone et al. |
| 7,031,667 B2 | 4/2006 | Horiguchi |
| 7,044,615 B2 | 5/2006 | Gesten |
| 7,062,796 B1 | 6/2006 | Dixon |
| 7,106,676 B2 | 9/2006 | Matos |
| 7,170,057 B2 | 1/2007 | Filipovich et al. |
| 7,211,778 B1 | 5/2007 | Smith et al. |
| 7,249,846 B2 | 7/2007 | Grand et al. |
| 7,261,409 B1 | 8/2007 | Taber |
| 7,308,231 B2 | 12/2007 | Tung |
| 7,312,699 B2 | 12/2007 | Chornenky |
| 7,313,246 B2 | 12/2007 | Miller et al. |
| 7,331,666 B2 | 2/2008 | Swab et al. |
| 7,381,952 B2 | 6/2008 | Teich et al. |
| 7,409,234 B2 | 8/2008 | Glezerman |
| 7,438,409 B2 | 10/2008 | Jordan |
| 7,461,936 B2 * | 12/2008 | Jannard ............... 351/158 |
| 7,467,866 B2 | 12/2008 | Chao |
| 7,484,847 B2 | 2/2009 | Fuziak, Jr. |
| 7,488,294 B2 | 2/2009 | Torch |
| 7,496,293 B2 | 2/2009 | Shamir et al. |
| 7,500,747 B2 | 3/2009 | Howell et al. |
| 7,520,614 B2 | 4/2009 | Joos et al. |
| 7,530,688 B2 | 5/2009 | Grogan et al. |
| 7,547,101 B2 | 6/2009 | Fuziak |
| 7,576,800 B2 | 8/2009 | Swain |
| 7,576,919 B2 | 8/2009 | Durner et al. |
| 7,581,833 B2 | 9/2009 | Howell et al. |
| 7,617,071 B2 | 11/2009 | Darley et al. |
| 7,639,209 B2 | 12/2009 | Sprague et al. |
| D610,184 S | 2/2010 | Pearson et al. |
| 7,665,845 B2 | 2/2010 | Kiderman et al. |
| 7,724,210 B2 | 5/2010 | Sprague et al. |
| 7,753,523 B2 | 7/2010 | Kiderman et al. |
| 7,758,185 B2 | 7/2010 | Lewis |
| 7,786,424 B2 | 8/2010 | Durner et al. |
| 7,798,638 B2 | 9/2010 | Fuziak, Jr. |
| 7,806,525 B2 | 10/2010 | Howell et al. |
| 7,810,750 B2 | 10/2010 | Abreu |
| 7,856,173 B2 | 12/2010 | Chujo et al. |
| 7,866,818 B2 | 1/2011 | Schroeder et al. |
| 7,869,128 B2 | 1/2011 | Yamaguchi et al. |
| 7,874,669 B2 | 1/2011 | Moritz et al. |
| 7,893,965 B2 | 2/2011 | Heim et al. |
| 7,918,556 B2 | 4/2011 | Lewis |
| 7,922,321 B2 | 4/2011 | Howell et al. |
| 7,997,723 B2 | 8/2011 | Pienimaa et al. |
| D645,492 S | 9/2011 | Zhao |
| D645,493 S | 9/2011 | Zhao |
| D646,316 S | 10/2011 | Zhao |
| 8,068,169 B2 | 11/2011 | Chang |
| 8,123,351 B2 | 2/2012 | Moritz et al. |
| 8,128,606 B2 | 3/2012 | Anderson et al. |
| 8,212,855 B2 | 7/2012 | Gupta et al. |
| 8,259,159 B2 | 9/2012 | Hu |
| 8,269,159 B2 | 9/2012 | Filipovich et al. |
| 8,289,231 B2 | 10/2012 | Budd et al. |
| 8,310,555 B2 | 11/2012 | Ludlow |
| 8,325,263 B2 | 12/2012 | Kato et al. |
| 8,333,475 B2 | 12/2012 | Sugio et al. |
| D674,834 S | 1/2013 | Esson |
| 8,414,131 B2 | 4/2013 | Tanaka |
| 8,430,510 B2 | 4/2013 | Sugio et al. |
| 8,431,881 B2 | 4/2013 | Filipovich et al. |
| 8,434,868 B2 | 5/2013 | Sato et al. |
| 8,446,676 B2 | 5/2013 | Sugihara et al. |
| 8,449,116 B2 | 5/2013 | Sato et al. |
| 8,503,703 B2 | 8/2013 | Eaton et al. |
| 8,758,021 B2 | 6/2014 | Takahashi |
| 8,854,429 B2 | 10/2014 | Seo et al. |
| 8,855,719 B2 | 10/2014 | Jacobsen et al. |
| 8,878,914 B2 | 11/2014 | Mashitani et al. |
| 8,928,752 B2 | 1/2015 | DeKeyser |
| 9,016,857 B2 | 4/2015 | Benko et al. |
| 9,028,062 B2 | 5/2015 | Kokonaski et al. |
| 9,028,123 B2 | 5/2015 | Nichol et al. |
| 9,140,910 B2 | 9/2015 | Filutowski et al. |
| 9,451,068 B2 | 9/2016 | Warren |
| 9,494,807 B2 | 11/2016 | Jannard |
| 9,619,201 B2 | 4/2017 | Jannard et al. |
| 9,720,240 B2 | 8/2017 | Jannard |
| 9,720,258 B2 | 8/2017 | Reyes |
| 9,720,260 B2 | 8/2017 | Calilung et al. |
| 2002/0039063 A1 | 4/2002 | Ritter |
| 2002/0039170 A1 | 4/2002 | Jannard et al. |
| 2002/0085175 A1 | 7/2002 | Butler |
| 2002/0085843 A1 | 7/2002 | Mann |
| 2002/0087330 A1 | 7/2002 | Lee et al. |
| 2002/0098877 A1 | 7/2002 | Glezerman |
| 2002/0098878 A1 | 7/2002 | Mooney et al. |
| 2002/0118825 A1 | 8/2002 | Mitra |
| 2002/0143912 A1 | 10/2002 | Michels et al. |
| 2002/0159023 A1 | 10/2002 | Swab et al. |
| 2002/0170147 A1 | 11/2002 | Heller |
| 2002/0176330 A1 | 11/2002 | Ramonowski et al. |
| 2002/0197961 A1 | 12/2002 | Warren |
| 2003/0018274 A1 | 1/2003 | Takahashi et al. |
| 2003/0022690 A1 | 1/2003 | Beyda et al. |
| 2003/0036360 A1 | 2/2003 | Russell et al. |
| 2003/0058406 A1 | 3/2003 | Blum et al. |
| 2003/0067585 A1 | 4/2003 | Miller et al. |
| 2003/0068057 A1 | 4/2003 | Miller et al. |
| 2003/0073460 A1 | 4/2003 | van Pelt et al. |
| 2003/0162510 A1 | 8/2003 | Kim |
| 2004/0000733 A1 | 1/2004 | Swab et al. |
| 2004/0029582 A1 | 2/2004 | Swab et al. |
| 2004/0048569 A1 | 3/2004 | Kawamura |
| 2004/0072134 A1 | 4/2004 | Takahashi |
| 2004/0120035 A1 | 6/2004 | Hoffmann |
| 2004/0128399 A1 | 7/2004 | Kurrasch |
| 2004/0128737 A1 | 7/2004 | Gesten |
| 2004/0132509 A1 | 7/2004 | Glezerman |

(56) References Cited

U.S. PATENT DOCUMENTS

| | | |
|---|---|---|
| 2004/0136293 A1 | 7/2004 | Matos |
| 2004/0156012 A1 | 8/2004 | Jannard et al. |
| 2004/0157649 A1 | 8/2004 | Jannard et al. |
| 2004/0160571 A1 | 8/2004 | Jannard et al. |
| 2004/0160572 A1 | 8/2004 | Jannard et al. |
| 2004/0160573 A1 | 8/2004 | Jannard et al. |
| 2004/0212776 A1 | 10/2004 | Spitzer et al. |
| 2004/0239874 A1 | 12/2004 | Swab et al. |
| 2004/0240404 A1 | 12/2004 | Ibrahim et al. |
| 2005/0040192 A1 | 2/2005 | Steven, III et al. |
| 2005/0046789 A1 | 3/2005 | Jannard et al. |
| 2005/0046790 A1 | 3/2005 | Jannard et al. |
| 2005/0052537 A1 | 3/2005 | Mizusawa |
| 2005/0128431 A1 | 6/2005 | Jannard et al. |
| 2005/0159182 A1 | 7/2005 | Lai |
| 2005/0185815 A1 | 8/2005 | Rickards |
| 2005/0201585 A1 | 9/2005 | Jannard et al. |
| 2005/0202857 A1 | 9/2005 | Seshadri et al. |
| 2005/0208457 A1 | 9/2005 | Fink et al. |
| 2005/0238194 A1 | 10/2005 | Chornenky |
| 2005/0239502 A1 | 10/2005 | Swab et al. |
| 2005/0275714 A1 | 12/2005 | Ishikawa et al. |
| 2006/0023158 A1 | 2/2006 | Howell et al. |
| 2006/0028400 A1 | 2/2006 | Lapstun et al. |
| 2006/0072067 A1 | 4/2006 | Jannard et al. |
| 2006/0093178 A1 | 5/2006 | Chen |
| 2006/0132382 A1 | 6/2006 | Jannard |
| 2006/0146277 A1 | 7/2006 | Jannard et al. |
| 2006/0160573 A1 | 7/2006 | Montvay |
| 2006/0183427 A1 | 8/2006 | Warren |
| 2006/0187404 A1 | 8/2006 | Ifergan |
| 2006/0192306 A1 | 8/2006 | Giller |
| 2006/0197907 A1 | 9/2006 | Jannard et al. |
| 2006/0203183 A1 | 9/2006 | Jannard et al. |
| 2006/0203184 A1 | 9/2006 | Jannard et al. |
| 2007/0000033 A1 | 1/2007 | Dixon |
| 2007/0008484 A1 | 1/2007 | Jannard |
| 2007/0013863 A1 | 1/2007 | Zelazowski |
| 2007/0013864 A1 | 1/2007 | Dietz |
| 2007/0030442 A1 | 2/2007 | Howell et al. |
| 2007/0037520 A1 | 2/2007 | Warren |
| 2007/0046887 A1 | 3/2007 | Howell et al. |
| 2007/0081123 A1 | 4/2007 | Lewis |
| 2007/0081124 A1 | 4/2007 | Lewis |
| 2007/0081125 A1 | 4/2007 | Lewis |
| 2007/0201000 A1 | 8/2007 | Jackson et al. |
| 2007/0208531 A1 | 9/2007 | Darley et al. |
| 2007/0222940 A1 | 9/2007 | Cohen |
| 2007/0225550 A1 | 9/2007 | Gattani et al. |
| 2008/0055410 A1 | 3/2008 | DeKeyser |
| 2008/0058681 A1 | 3/2008 | Casali et al. |
| 2008/0089545 A1 | 4/2008 | Jannard et al. |
| 2008/0144854 A1 | 6/2008 | Abreu |
| 2008/0165317 A1 | 7/2008 | Wilson |
| 2008/0169998 A1 | 7/2008 | Jacobsen et al. |
| 2008/0192114 A1 | 8/2008 | Pearson et al. |
| 2008/0204589 A1 | 8/2008 | Chang |
| 2008/0239232 A1 | 10/2008 | Guerrero |
| 2008/0246694 A1 | 10/2008 | Fischer |
| 2008/0273084 A1 | 11/2008 | MacDougall et al. |
| 2008/0284974 A1 | 11/2008 | Siu |
| 2009/0015929 A1 | 1/2009 | DeJong et al. |
| 2009/0040361 A1 | 2/2009 | Heim et al. |
| 2009/0059381 A1 | 3/2009 | Jannard |
| 2009/0066910 A1 | 3/2009 | Jannard et al. |
| 2009/0086159 A1 | 4/2009 | Jannard |
| 2009/0122253 A1 | 5/2009 | Clay |
| 2009/0128700 A1 | 5/2009 | Oshino et al. |
| 2009/0180195 A1 | 7/2009 | Cakmakci et al. |
| 2009/0190026 A1 | 7/2009 | Chen |
| 2009/0201460 A1 | 8/2009 | Blum et al. |
| 2009/0201466 A1 | 8/2009 | Knecht et al. |
| 2009/0213236 A1 | 8/2009 | Chiou et al. |
| 2009/0251661 A1 | 10/2009 | Fuziak, Jr. |
| 2009/0307828 A1 | 12/2009 | Ludlow |
| 2010/0002186 A1 | 1/2010 | Zelman |
| 2010/0053591 A1 | 3/2010 | Gibson et al. |
| 2010/0110368 A1 | 5/2010 | Chaum |
| 2010/0111472 A1 | 5/2010 | DeJong |
| 2010/0118402 A1 | 5/2010 | Washisu |
| 2010/0128135 A1 | 5/2010 | Filipovich et al. |
| 2010/0177168 A1 | 7/2010 | Hu |
| 2010/0177201 A1 | 7/2010 | Filipovich et al. |
| 2010/0188489 A1 | 7/2010 | Mashitani et al. |
| 2010/0208121 A1 | 8/2010 | Kato et al. |
| 2010/0220282 A1 | 9/2010 | Moritz et al. |
| 2010/0238396 A1 | 9/2010 | Jannard |
| 2010/0245755 A1 | 9/2010 | Sugihara et al. |
| 2010/0253904 A1 | 10/2010 | Jannard |
| 2010/0265455 A1 | 10/2010 | Jannard et al. |
| 2010/0277563 A1 | 11/2010 | Gupta et al. |
| 2010/0309426 A1 | 12/2010 | Howell et al. |
| 2010/0309427 A1 | 12/2010 | Warren |
| 2011/0013283 A1 | 1/2011 | Sato |
| 2011/0043644 A1 | 2/2011 | Munger et al. |
| 2011/0050546 A1 | 3/2011 | Swartz, Jr. et al. |
| 2011/0080555 A1 | 4/2011 | Chow |
| 2011/0085135 A1 | 4/2011 | Bertolli |
| 2011/0102733 A1 | 5/2011 | Moritz et al. |
| 2011/0170065 A1 | 7/2011 | Sugio et al. |
| 2011/0170066 A1 | 7/2011 | Sugio et al. |
| 2011/0170067 A1 | 7/2011 | Sato et al. |
| 2011/0178784 A1 | 7/2011 | Sato et al. |
| 2011/0193963 A1 | 8/2011 | Hess et al. |
| 2011/0255050 A1 | 10/2011 | Jannard et al. |
| 2011/0261166 A1 | 10/2011 | Olazaran |
| 2011/0261176 A1 | 10/2011 | Monaghan, Sr. et al. |
| 2011/0310345 A1 | 12/2011 | Warren |
| 2012/0013843 A1 | 1/2012 | Jannard |
| 2012/0081658 A1 | 4/2012 | Sugihara et al. |
| 2012/0169990 A1 | 7/2012 | Burnstein |
| 2012/0224135 A1 | 9/2012 | Moritz |
| 2013/0100534 A1 | 4/2013 | Jannard |
| 2013/0128216 A1 | 5/2013 | Filutowski et al. |
| 2013/0212765 A1 | 8/2013 | Cornelius |
| 2013/0235331 A1 | 9/2013 | Heinrich et al. |
| 2013/0281166 A1 | 10/2013 | Warren |
| 2014/0098424 A1 | 4/2014 | Jannard |
| 2014/0268017 A1 | 9/2014 | Sweis |
| 2015/0116655 A1 | 4/2015 | Jannard |
| 2015/0177521 A1 | 6/2015 | Abdollahi et al. |
| 2016/0004103 A1 | 1/2016 | Reyes |
| 2016/0085092 A1 | 3/2016 | Calilung et al. |
| 2017/0090199 A1 | 3/2017 | Jannard |
| 2017/0134550 A1 | 5/2017 | Warren |

FOREIGN PATENT DOCUMENTS

| | | |
|---|---|---|
| DE | 299 01 673 U1 | 2/1999 |
| EP | 1 665 730 | 3/2009 |
| FR | 1 160 007 | 7/1958 |
| FR | 2 820 936 | 8/2002 |
| GB | 2472120 A | 1/2011 |
| JP | 58-26282 | 2/1983 |
| JP | 58-113912 A | 7/1983 |
| JP | 58-113914 A | 7/1983 |
| JP | 62-005024 | 1/1987 |
| JP | 04-023579 A | 1/1992 |
| JP | 04-086642 A | 3/1992 |
| JP | 08-009483 A | 1/1996 |
| JP | 10-513021 | 12/1998 |
| JP | 2001-522063 | 11/2001 |
| JP | 2005-086522 A | 3/2005 |
| JP | 2007-148131 | 6/2007 |
| JP | 2008-545287 A | 12/2008 |
| JP | 2011-180414 A | 9/2011 |
| JP | 3171527 | 10/2011 |
| WO | WO 01/95018 | 12/2001 |
| WO | WO 2004/012477 | 2/2004 |
| WO | WO 2006/055884 | 5/2006 |
| WO | WO 2006/086699 | 8/2006 |
| WO | WO 2006/120416 | 11/2006 |
| WO | WO 2007/068808 | 6/2007 |
| WO | WO 2008/076774 | 6/2008 |

(56) References Cited

FOREIGN PATENT DOCUMENTS

| WO | WO 2008/082718 | 7/2008 |
|---|---|---|
| WO | WO 2010/098902 | 9/2010 |
| WO | WO 2013/019893 | 2/2013 |
| WO | WO 2013/027752 | 2/2013 |
| WO | WO 2013/123264 | 8/2013 |
| WO | WO 2013/188343 | 12/2013 |
| WO | WO 2014/149631 | 9/2014 |
| WO | WO 2014/201213 | 12/2014 |

OTHER PUBLICATIONS

Complaint for Patent Infringement; U.S. District Court—Central District of California, Southern Division; Case No. SACV 07-57 DOC (Anx); Oakley, Inc. v. Blue Diamond International, filed Jan. 16, 2007; this lawsuit resulted in a default judgment.

Complaint for Patent Infringement; U.S. District Court—Central District of California, Southern Division; Case No. SACV 07-671 AG (RNBx); Oakley, Inc. v. XONIX (Zhuhai) Electronics Co., Ltd. et al., filed Jun. 7, 2007; this lawsuit was settled and dismissed.

"Fashionable Eyewear Charms to add Color, Style & Fun to Eyeglass Frams", Ficklets—Eyewear Charm Huggers. http://www.ficklets.com. Jul. 22, 2009.

International Search Report and Written Opinion, re PCT Application No. PCT/US2010/021044, issued Mar. 31, 2010 in 16 pages.

Mark Hanchett Declaration Under 37 CFR §1.132 in U.S. Appl. No. 13/400,486, dated Sep. 4, 2012, in 5 pages.

\* cited by examiner

SYSTEMS AND METHODS FOR REMOVABLY COUPLING AN ELECTRONIC DEVICE TO EYEWEAR

CROSS-REFERENCE TO RELATED APPLICATIONS

This application claims the benefit of priority to U.S. Provisional No. 61/600,563, filed Feb. 17, 2012, U.S. Provisional No. 61/741,796, filed Feb. 20, 2012, and U.S. Provisional No. 61/601,551, filed Feb. 21, 2012, each of which are expressly incorporated by reference in their entireties.

BACKGROUND

Field

This disclosure generally relates to wearable headwear. Specifically, this disclosure relates to wearable headwear that includes removable electronic and/or mechanical devices.

Description of the Related Art

There are numerous situations in which it is convenient and preferable to mount electronic and/or mechanical devices so that they can be worn on the head of a user. Such devices can be used for portable entertainment, personal communications, making recordings, and the like.

However, with such mountable devices, whenever a user wants to wear glasses or sunglasses, the user must adjust or remove the devices from their ears. Further, it is often quite uncomfortable to wear both a mountable device and a pair of sunglasses at the same time. Such discomfort, when applied for a long period of time, can cause muscular pain and/or headaches. In addition, cables that may extend from the mountable device to other third party devices and the instability of simultaneously wearing eyewear and a mountable device can limit mobility of the wearer; particularly those participating in law enforcement activities. Thus, there exists a need for improved mountable electronic and/or mechanical devices for providing utility to a wearer.

SUMMARY

One aspect of the disclosure provides an eyeglass. The eyeglass includes an eyeglass frame adapted to be carried by a head of a wearer, at least a first lens, and at least a first lens support portion of the eyeglass frame configured to position the at least first lens in a path of a field of view of a wearer. The eyeglass further includes an attachment device that comprises a first connector and a second connector, where the first connector removably couples the attachment device to the eyeglass frame. The eyeglass further includes an electronic device, where the second connector removably couples the electronic device to the attachment device.

Another aspect of the disclosure provides a dual attachment member that includes an attachment device and an electronic device. The attachment device includes a first connector and a second connector, where the first connector removably couples the attachment device to a headwear apparatus. The second connector removably couples the electronic device to the attachment device.

Another aspect of the disclosure provides an implementation of a method for removably coupling an electronic device to eyewear. The method includes placing an attachment device against an inside end of a support member of an eyewear frame, where the attachment device comprises a first connector and where the inside end is an end of the support member closer to a wearer of the eyewear frame. The method further includes rotating a second plate of the first connector about a hinge of the first connector, where the hinge couples a first end of a first plate of the first connector to a first end of the second plate, and wherein the second plate comprises a second connector. The method further includes locking a second end of the first plate to a second end of the second plate. The method further includes attaching the electronic device to the second connector.

Another aspect of the disclosure provides an implementation of a method for removably coupling an attachment device to eyewear. The method includes placing the attachment device against an inside end of a support member of an eyewear frame, where the attachment device comprises a first connector, and where the inside end is an end of the support member closer to a wearer of the eyewear frame. The method further includes rotating a second plate of the first connector about a hinge of the first connector, where the hinge couples a first end of a first plate of the first connector to a first end of the second plate, and where the second plate comprises a second connector that removably couples an electronic device to the attachment device. The method further includes locking a second end of the first plate to a second end of the second plate.

BRIEF DESCRIPTION OF THE DRAWINGS

Features and aspects, and advantages of the embodiments of the invention are described in detail below with reference to the drawings of various embodiments, which are intended to illustrate and not to limit the invention. The drawings include the following figures in which.

DETAILED DESCRIPTION OF THE EMBODIMENT

Figure 1:
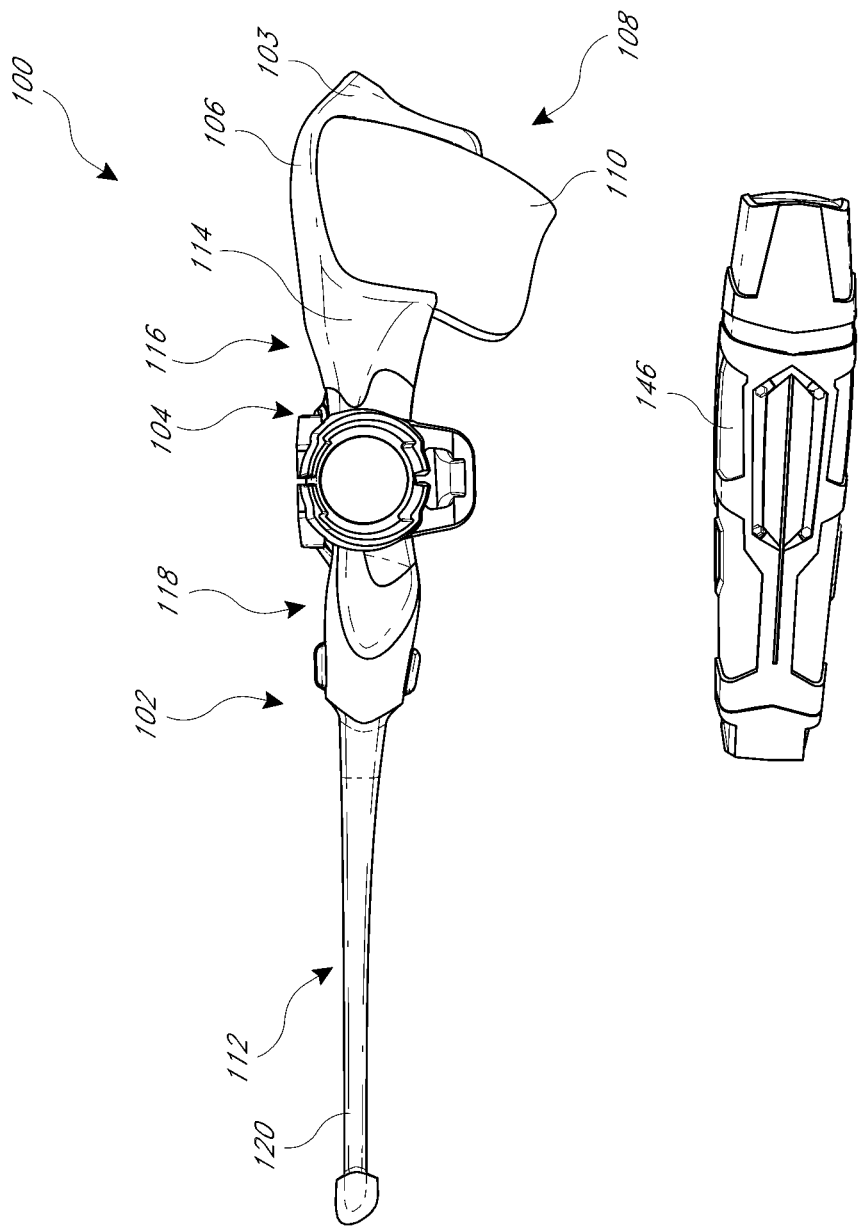
FIG. 1 is a side view of a support assembly in accordance with one embodiment of the present disclosure.

Systems and methods of the present disclosure are directed to adequately coupling an object (e.g., a communication module, a music module, an audio-video module, an illuminator, etc.) and a structure (e.g., a support assembly). Adequate mechanical coupling will depend on the object, the available structure, and the purposes the object and structure serve after coupling is established. Coupling may involve maintaining a relationship between the object and the structure (e.g., orienting, positioning, maintaining, retaining, etc.). Coupling may involve supporting the object by the structure (e.g., attaching, holding, fixing, mounting, etc.). Any or all of the functions discussed above in any combination may be provided by an apparatus herein called a detachable module.

A detachable module includes any component or combination of components capable of coupling an object and a structure. A first portion of the detachable module may couple the object and the detachable module and a second portion of the detachable module may couple the detachable module and the structure. The operation of the first portion is substantially independent of operation of the second portion. In some embodiments, the detachable module substantially prevents movement of the object with respect to the structure. In other embodiments, the detachable module permits one or more degrees of freedom of the object, the structure, or both with respect to each other (e.g., rotational, translational, limited rotations, translations, etc.).

A clasp includes any apparatus for establishing a releasable coupling. The clasp may have at least an open position and a closed position. A clasp may be maintained in the closed position by a coupling (e.g., a latch). Portions of the clasp may form the latch. The clasp may include two components that are separable or movable with respect to each other to attain the open position and that are coupled (e.g., fixed, attached, confined, attracted, held, adhered, encircled, captured, wrapped) to or with each other to attain the closed position.

A latch includes any apparatus for establishing a releasable coupling involving surfaces that abut to prevent release. The latch may have at least an open position and a closed position. The latch may be maintained in the closed position by a force (e.g., expansion of material, contraction of material, spring force, torsion, tension, friction, stiction, reaction force of abutting relatively incompressible surfaces, etc.). To release a latch, the surfaces may generally be moved with respect to each other to avoid abutment. A latch may remain in a closed state due to the existence of potential energy (e.g., stored torsion, tension, elasticity, etc.). A latch in a closed position may be in a stable state where potential energy is not involved to maintain the position. Energy may be expended to move a latch out of its closed position.

A magnetic clasp includes any clasp that is maintained in the closed position by magnetic flux. A portion of the clasp may have suitable magnetic permeability for being part of a path for the magnetic flux. A portion of the clasp may provide some or all of the magnetic flux (e.g., clasp includes a magnet, clasp is magnetized, etc.).

A hinge includes any apparatus that permits movement of a first surface about an axis with respect to a second surface. When the hinge and the surfaces are coextensive of the same material, the hinge is referred to as a living hinge. A barrel hinge includes a bearing that cooperates with at least one hollow cylinder formed in or coupled to each surface. The axis of a barrel hinge coincides with the central axis of the bearing (e.g., pin, post, shaft, bump, etc.).

A lip includes any apparatus that grips the exterior surface of an object (e.g., by attracting, attaching, adhering, holding, clamping, encircling, capturing, wrapping, clasping, etc.). The exterior surface may have undulations that cooperate with the lip to accomplish gripping. The exterior surface and the lip may cooperate as a latch.

A detachable module according to various aspects of the present disclosure includes a fold over clasp comprising at least a portion of a magnetic clasp. In an embodiment where the fold over clasp includes two components, the portion of a magnetic clasp may be implanted on, in, or with the first component, the second component, or both components. The combination provides simplicity of manufacturing and operation. Such a detachable module may be used to couple an object (e.g., a communication module, a music module, an audio-video module, an illuminator, etc.) to a structure (e.g., a support assembly) by coupling (e.g., fixing, attaching, confining, attracting, holding, adhering, encircling, capturing, wrapping, etc.) the structure with the fold over clasp and maintaining a relationship with the object via the magnetic clasp. The fold over clasp may employ a latch to maintain the closed position of the fold over clasp.

A magnetic flux circuit of the magnetic clasp may employ a relatively higher permeability material to permit the remainder of the detachable module to be formed of a relatively lower magnetic permeability material, avoiding the cost and weight of ferromagnetic materials.

The relatively lower permeability material may include one or more of conventional polymer, plastic, or resin. This material may be formed using conventional techniques including, for example, injection molding, blow molding, compression molding, extrusion, casting, rotomolding, rotocasting, and/or the like. The relatively higher permeability material may be formed into a sheet or wafer (e.g., circle, oval, rectangle, regular polygon, etc.) with suitable thickness (uniform, stepped, graded) by one or more conventional techniques including, for example, molding, casting, stamping, cut sheet, web processing, and/or the like. In some embodiments, the relatively higher permeability material may be unmagnetized. In other embodiments, the relatively higher permeability material may be magnetic or magnetized, for example, as a source of magnetic flux for the magnetic clasp.

In an embodiment, the relatively higher permeability material is held in a suitable position by at least a portion of the magnetic clasp. When the magnetic clasp includes a cup shape having an interior, such a portion of the magnetic clasp may include one or more interior surfaces of the cup.

Assembly of a pivot of the fold over clasp may consequently assist in maintaining, or may substantially maintain, a suitable position of the relatively higher permeability material of the magnetic clasp. The magnetic clasp may include structure to substantially support the object. Support may provide a substantially rigid mount for the object to the structure.

In an embodiment, the magnetic clasp includes one or more surfaces that maintain an orientation of the object with respect to the structure. Such surfaces may cooperate by abutment, stiction, and/or friction. Such surfaces may be implemented on one or more portions of the magnetic clasp. Such surfaces may be implemented on one or more portions of each of the magnetic clasp and the object.

A portion of the latch of the fold over clasp may flex to facilitate positioning of the relatively higher permeability material and to facilitate holding the relatively higher permeability material by at least a portion of the magnetic clasp. For example, flexing may provide a tension to facilitate holding.

In an embodiment, the portion of the fold over clasp that serves as a portion of the magnetic clasp may include a slot that is temporarily spread to facilitate assembly of the fold over clasp to include the relatively higher permeability material. For example, the portion of the fold over clasp that serves as a portion of the magnetic clasp may include a left portion, a right portion coupled to the left portion, and a first coupling that permits the left portion and right portion to be spread away from each other. The first coupling may include one or more surfaces that function as part of the latch of the fold over clasp.

Figure 33:
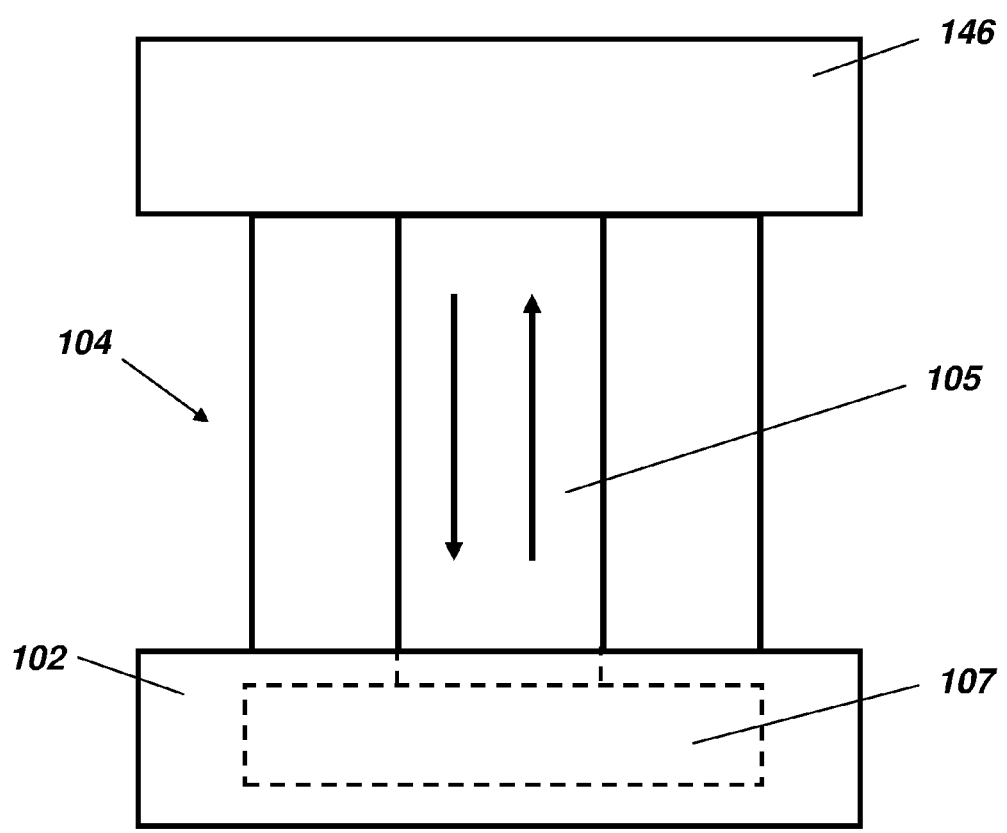
FIG. 33 is one embodiment of a support, a detachable module, a second module, and a medium capable of carrying signals.

A support assembly 100 in accordance with one embodiment of the present disclosure is illustrated in FIG. 1. The support assembly 100 generally includes a support 102 and a detachable module 104, and can be any structure worn by a wearer that is adapted to carry, hold, or contain another device, such as an electronic device 107 (as shown in FIG. 33). For example, the support assembly 100 can be or include an audio device. In addition, the support assembly 100 can include an eyeglass frame, sports or other protective goggle, visors, magnifiers, masks, headwear without lenses, or other eyewear assembly. The support assembly 100 may be symmetric in a conventional manner about bridge 103. Although generally described herein as a detachable module, the module 104 can also be permanently mounted (by rigid fixation, or adjustably as disclosed in greater detail below) to a support member (e.g., earstem, temple, temple arm, headband, strap or outrigger of a goggle, hook over an ear, loop, support, etc.), slide rail, or other component of the eyeglass or other headwear. The support assembly 100 may be constructed of suitable conventional materials using suitable conventional technologies.

The support 102 is generally any structure capable of being worn that is also able to carry a device such as an electronic device. The support 102 can include any of a variety of wearable structures such as, for example, a hat, a belt, a vest, an article of clothing, and/or eyewear, including eyeglasses. In some embodiments, the support 102 is configured to support the detachable module 104 such that the detachable module 104 is directed into the field of the user's view. In other embodiments, the support 102 is configured to support the detachable module 104 for purposes unrelated to the field of the user's view. For example, the support 102 may support the detachable module 104 such that the detachable module 104 is within a convenient reach of the user.

The detachable module 104 is any structure capable of being carried by the support 102. In one embodiment, the detachable module 104 includes a housing containing a connection assembly, as is described in greater detail below.

In the illustrated embodiment, the support 102 includes eyeglasses, which have a frame 106 that can include at least one lens support 108. The lens support 108 (e.g., orbital) is adapted to hold at least one lens 110 in the field of vision of the wearer of the support assembly 100.

The support 102 also includes at least one support member 112 (e.g., earstem, temple, temple arm, headband, strap or outrigger of a goggle, hook over an ear, loop, support, etc.). For example, the support 102 may include a first support member 112 and a second support member 112 (e.g., the support 102 may include an earstem positioned adjacent to the left side of a head and an earstem positioned adjacent to the right side of the head, a temple positioned adjacent to the left side of a head and a temple positioned adjacent to the right side of the head, a temple arm positioned adjacent to the left side of a head and a temple arm positioned adjacent to the right side of the head, a first headband positioned adjacent to the left side of a head that couples to a second headband positioned adjacent to the right side of the head, a first strap or outrigger of a goggle positioned adjacent to the left side of a head that couples to a second strap or outrigger of a goggle positioned adjacent to the right side of the head, a hook over a left ear and a hook over a right ear, a first loop positioned adjacent to the left side of a head that couples to a second loop positioned adjacent to the right side of the head, a support positioned adjacent to the left side of a head and a support positioned adjacent to the right side of the head, etc.). As another example, the support 102 may include a single support member 112 (e.g., the support 102 may include an earstem, temple, or temple arm positioned adjacent to the left side of a head or a right side of the head, a headband that wraps around a top, bottom, and/or side of a head, a strap or outrigger of a goggle that wraps around a top, bottom, and/or size of a head, a hook over a left ear or a hook over a right ear, a loop, etc.).

The support member 112 is coupled to the frame 106 with a coupling 114 located at the anterior portion 116 of the support member 112. In one embodiment, the coupling 114 is a hinge, although the coupling 114 can be any structure known to those of skill in the art for coupling an support member 112 to a frame 106. In other embodiments, the support 102 does not include a coupling 114. In such embodiments, the at least one support member 112 are integrally formed with the frame 106.

The support member 112 includes a support section or rail 118 and a head contacting portion 120. The rail 118 is designed to engage a corresponding clamp on the detachable module 104. The detachable module 104 is detachably coupled to the rail 118 by any of a variety of mechanisms, such as those described in greater detail below. In some implementations, the detachable module 104 is adapted to not move with respect to rail 118. In other implementations, the detachable module 104 is adapted to move with respect to the rail 118. In one embodiment, the detachable module 104 moves along the rail's longitudinal axis in an anterior-posterior (or posterior-anterior) direction (not shown). Axial movement of the detachable module 104 with respect to the rail 118 may be limited in the anterior direction and the posterior direction by stops (not shown).

The head contacting portion 120 of the support member 112 can be provided with an elastomeric traction device, such as that disclosed in U.S. Pat. No. 5,249,001, filed Aug. 27, 1991, which is incorporated by reference herein. A padded portion on the head contacting portion 120 is generally made from a soft material, such as a foam, a plastic, cloth, or any of a variety of soft polymers, and provides a comfortable interface between the wearer's head and the support assembly 100 when worn by a user.

A second module 146 can be attached to the detachable module 104. In one embodiment, the detachable module 104 includes as an attachment one or more of a communication module, a music module, an audio-video module, an illuminator, and/or another electronics module. In one embodiment, the detachable module 104 includes as an attachment an audio-video module that allows the wearer of the support assembly 100 to capture snapshots or video of the wearer's surroundings and/or audio of the wearer's surroundings. For example, the second module 146 can include a still camera, a video camera, an infrared camera, a thermal imaging camera, and/or another type of visual or aural recording device. In another embodiment, the detachable module 104 includes as an attachment a communications module that allows the wearer of the support assembly 100 to wirelessly communicate with an electronic device. For example, the second module 146 can include one or more of a speaker, a microphone, a power supply and a Bluetooth or other radio frequency transceiver for wirelessly communicating with a remote device such as a cellular telephone.

In another embodiment, the detachable module 104 includes as an attachment one or more of a noise module, a flashlight, a laser pointer, a substance dispenser, an object launcher, and/or another mechanical module. In one embodiment, the second module 146 is a pepper spray dispenser that allows the wearer of the support assembly 100 to disperse pepper spray in the wearer's vicinity.

In some embodiments, the detachable module 104 provides a mechanism to allow the second module 146 and the support assembly 100 to communicate. For example, the detachable module 104 may include a medium 105 capable of carrying signals (e.g., a trace, a wire, a cable, etc.), electrical inputs, electrical outputs, and/or other circuitry such that an electrical connection and/or a data connection is established between the second module 146 and the support assembly 100. An embodiment of a detachable module 104 and a medium 105 capable of carrying signals is illustrated in FIG. 33, the medium allowing the second module 146 and the support assembly 100 to communicate, as explained above. Thus, the second module 146 may be configured to transmit electrical signals (e.g., data, control signals, power, etc.) to the support assembly 100 and may be configured to receive electrical signals from the support assembly 100.

In the embodiment illustrated in FIG. 1, the rail 118 is a longitudinal segment of the support member 112. In the illustrated embodiment, the rail 118 is in line with the longitudinal axis of the support member 112. However, in other embodiments, not shown, the rail 118 is spaced an offset distance from the longitudinal axis of the support member 112.

The lens supports 108 of the support 102 can be integrally formed with the frame 106, such as illustrated in FIG. 1. However, in other embodiments, the lens supports 108 are hingably connected to the frame 106. By hingably coupling the lens supports 108 to the frame 106, the lenses 110 may be rotated about a hinge axis and moved out of the wearer's line of sight when desired. For example, if lenses 110 include sunglass lenses then lens support hinge 128 allows the wearer of the support assembly 100 to lift the lenses 110 out of the field of view when the wearer moves indoors without removing the support assembly 100 from his head. In any of the embodiments herein, the lenses may be supported in a "rimless" design as is understood in the art, in which the lens is attached to the frame or other adjacent components without the use of a lens support.

Figure 2:
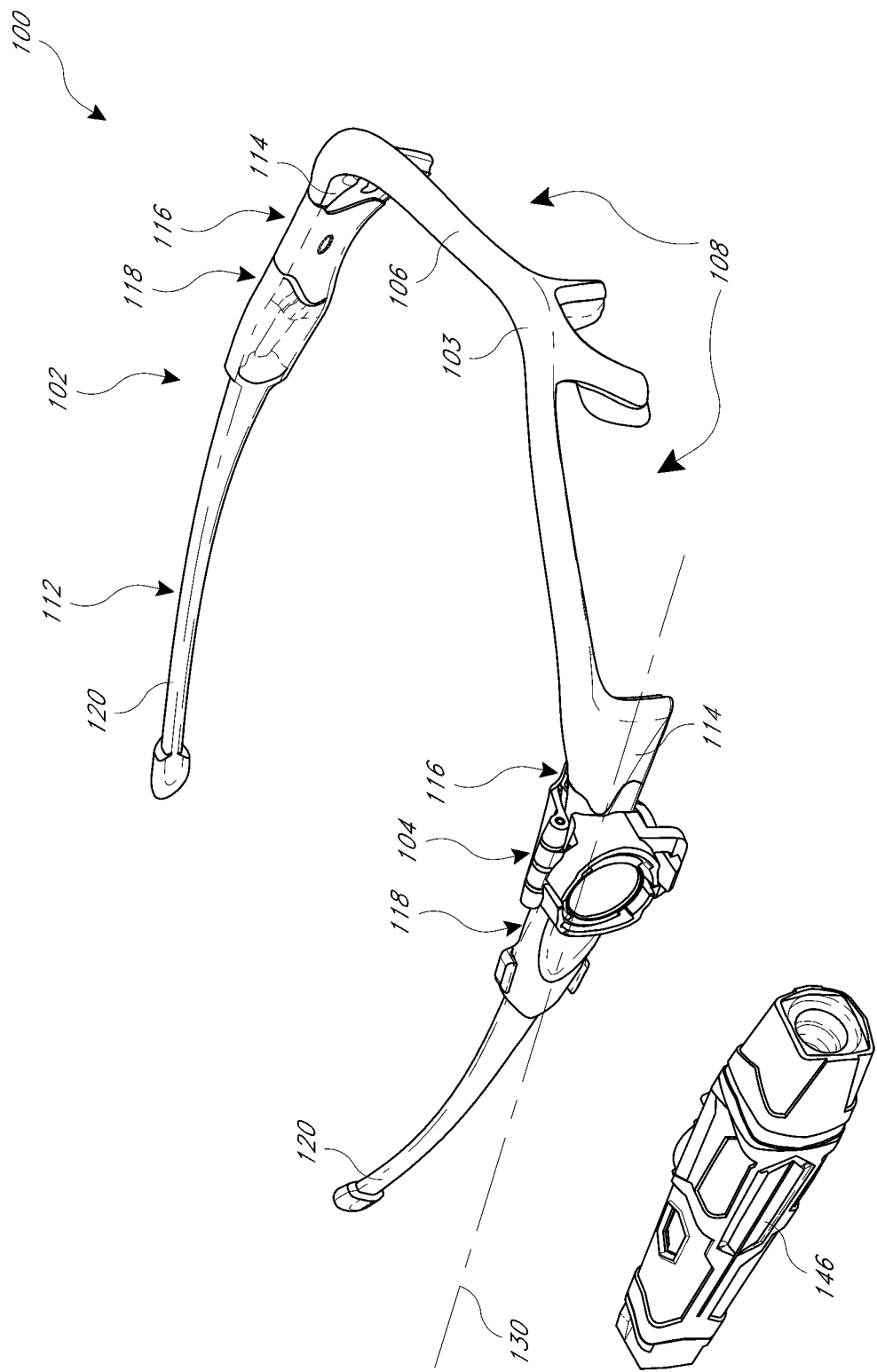
FIG. 2 is a partial side view of the support assembly of FIG. 1 showing lenses moved out of a wearer's field of view.

Another embodiment of a support assembly 100 is illustrated in FIG. 2. In the illustrated embodiment, at least a portion of the rail 118 has a non-round cross-sectional shape to prevent undesired rotation of the detachable module 104 about the rail 118 longitudinal axis 130. The rail 118 cross-sectional shape may be any of a variety of shapes, including noncircular shapes to prevent undesired rotation. For example, in one embodiment, the rail 118 cross-sectional shape is oval, elliptical, square, triangular, or any other noncircular shape. In one embodiment, the rail 118 includes an edge extending along a portion of its longitudinal axis 130, which prevents rotation of the detachable module 104 about the rail 118. The module clamp may be provided with complementary clamping surfaces, for conforming to the cross sectional configuration of the rail to permit axial (anterior-posterior) adjustability while resisting or preventing rotation about the axis of the rail.

In addition, any of a variety of anti-rotational structures may be provided with, or coupled to the rail 118 and the detachable module 104. For example, the anti-rotational structure can include a high friction surface to provide a friction fit, a locking arrangement, a pin, or any other structure known to those of skill in the art. In other embodiments, the rail 118 has a substantially circular cross-sectional shape and the detachable module 104 includes a suitable structure for preventing rotation of the detachable module 104 about the rail 118 longitudinal axis 130. For example, the detachable module 104 can include a friction mount, a rubber or elastomeric polymer pad, or other locking mechanism to prevent rotation about the rail 118.

The rail 118 can be located at any of a variety of locations with respect to the frame 106. In general, the rail 118 is located in the anterior two-thirds of the support member 112. Alternatively, the rail 118 is in the anterior half of the support member 112.

Figure 3:
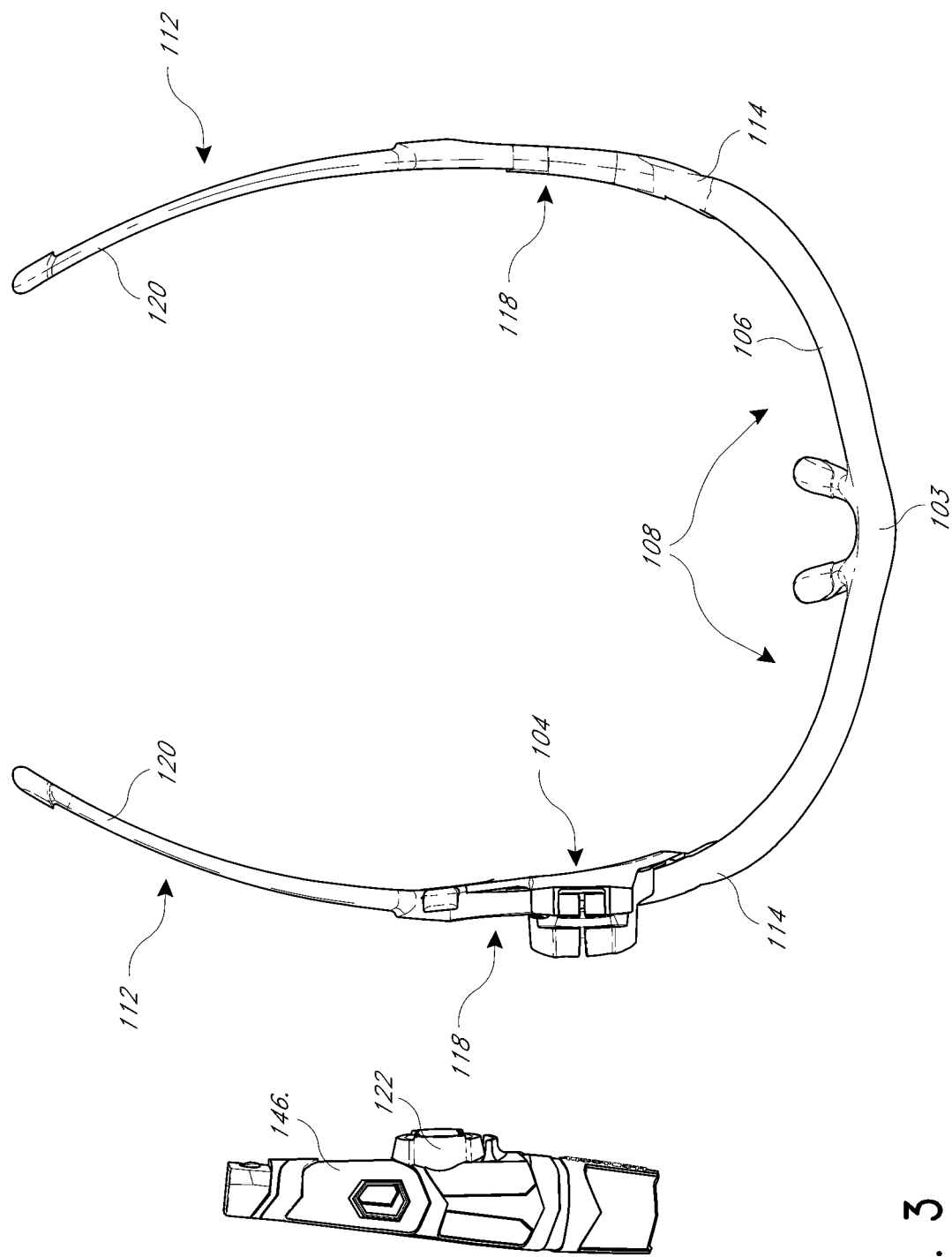
FIG. 3 is a top view of the support assembly of FIG. 1.

Another embodiment of a support assembly 100 is illustrated in FIG. 3. The second module 146 can be removably attached to the detachable module 104 via a connector assembly 122. In one embodiment, the detachable module 104 may include a coupling device that can be paired with the connector assembly 122. For example, the connector assembly 122 may include a magnet and the detachable module 104 may include a magnet, where the connector assembly 122 magnet and the detachable module 104 magnet are polar opposites such that the two magnets are attracted to each other. In other embodiments, the detachable module 104 and the connector assembly 122 are paired using any known connection medium, such as by using a mount, button, clip, clip-on, tape, or the like.

In another embodiment, the second module 146 is permanently affixed to the detachable module 104. The second module 146 can be permanently attached to the detachable module 104 using any known connection medium, such as with an adhesive, weld, glue, or the like, or formed entirely or partially by insert molding or co-molding processes to produce the second module 146 and the detachable module 104 in a unitary or monolithic module.

Figure 23:
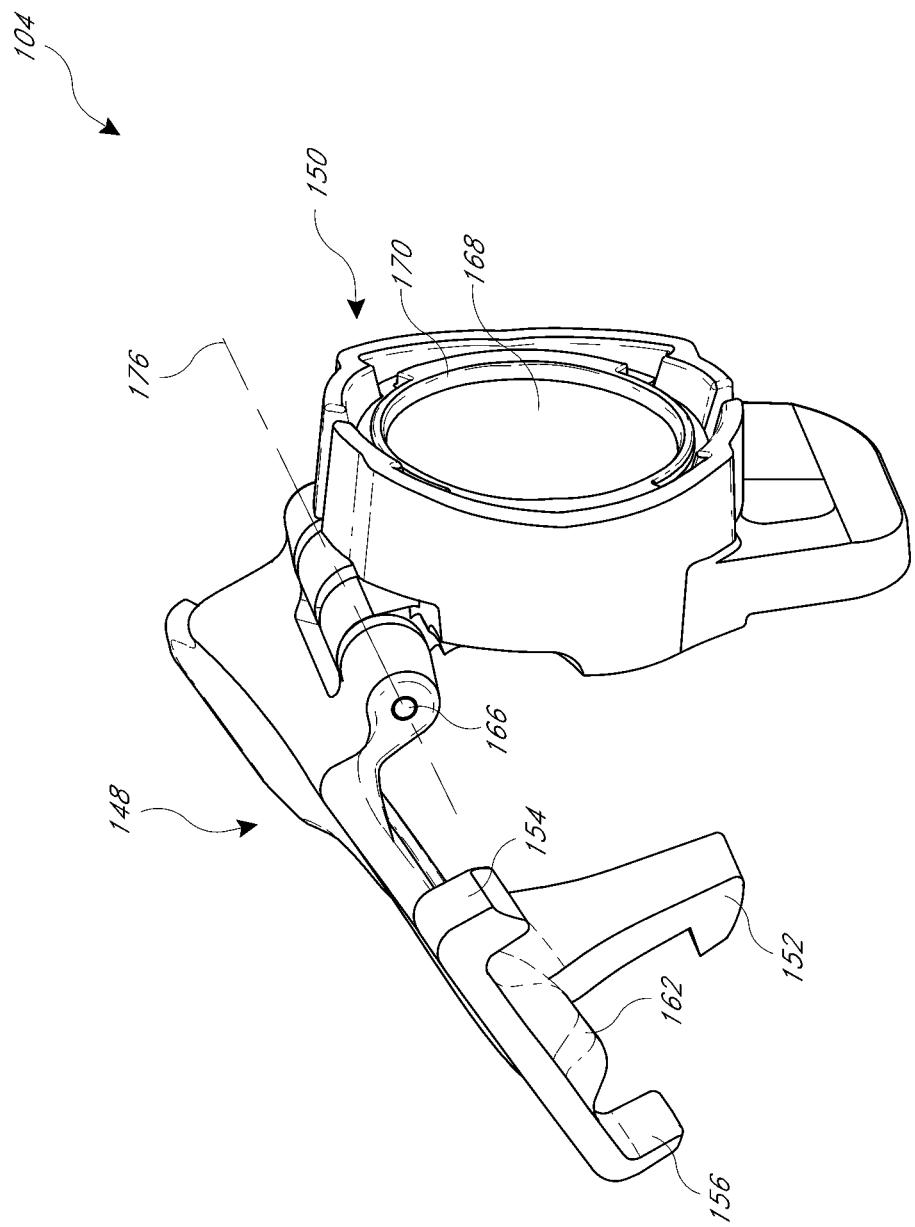
FIG. 23 shows one aspect of the angular adjustability of the first plate and the second plate of the detachable module of FIG. 6.

Any of a variety of couplings can be utilized with the detachable module 104 for releasably or permanently attaching the detachable module 104 to an eyeglass frame or other support. Likewise, any of a variety of couplings can be utilized with the detachable module 104 and the second module 146 for releasably or permanently attaching the detachable module 104 to the second module 146. In many applications, releasable connections are preferred. The coupling may be an integral component of the detachable module 104 and/or the second module 146, or may be attached to the detachable module 104 and/or the second module 146. In general, the coupling for the detachable module 104 will include at least a first coupling surface for contacting a first surface on the rail or other support from which the coupling will depend, and a second coupling surface for contacting a second surface on the support. The first and second coupling surfaces are generally moveable with respect to each other, such as to permit positioning the coupling over or around the structure to which it is to be attached, and then tightened to the structure by bringing the first and second coupling surfaces towards each other, as is illustrated in FIG. 23. The configuration of the first and second coupling surfaces, or third or fourth or more, depending upon the design, can be provided with any of a variety of configurations. Normally, the coupling surfaces will be configured in a manner that cooperates with the complementary shape of the rail, support member, or other component to which they are to be attached.

Likewise, in general, the coupling for the detachable module 104 and the second module 146 will include at least a first coupling surface for contacting a first surface on the detachable module 104 or other support from which the coupling will depend, and a second coupling surface for contacting the second module 146.

In an embodiment in which the detachable module 104 may be attached (at the user's choice) to either a left support member or a right support member of an eyeglass, the coupling is pivotably or otherwise moveably connected to the module 104, to permit shifting between a "right hand" and "left hand" coupling configuration. Certain specific examples will be given below. Alternatively, in certain embodiments, a left hand module and a right hand module are provided as a system, such that, in the case that the second module 146 is a camera, everything in the line of sight of the wearer can be captured. In this application, a first detachable module 104 may be adapted for coupling to the left support member and a second detachable module 104 may be adapted for coupling to the right support member.

Figure 4:
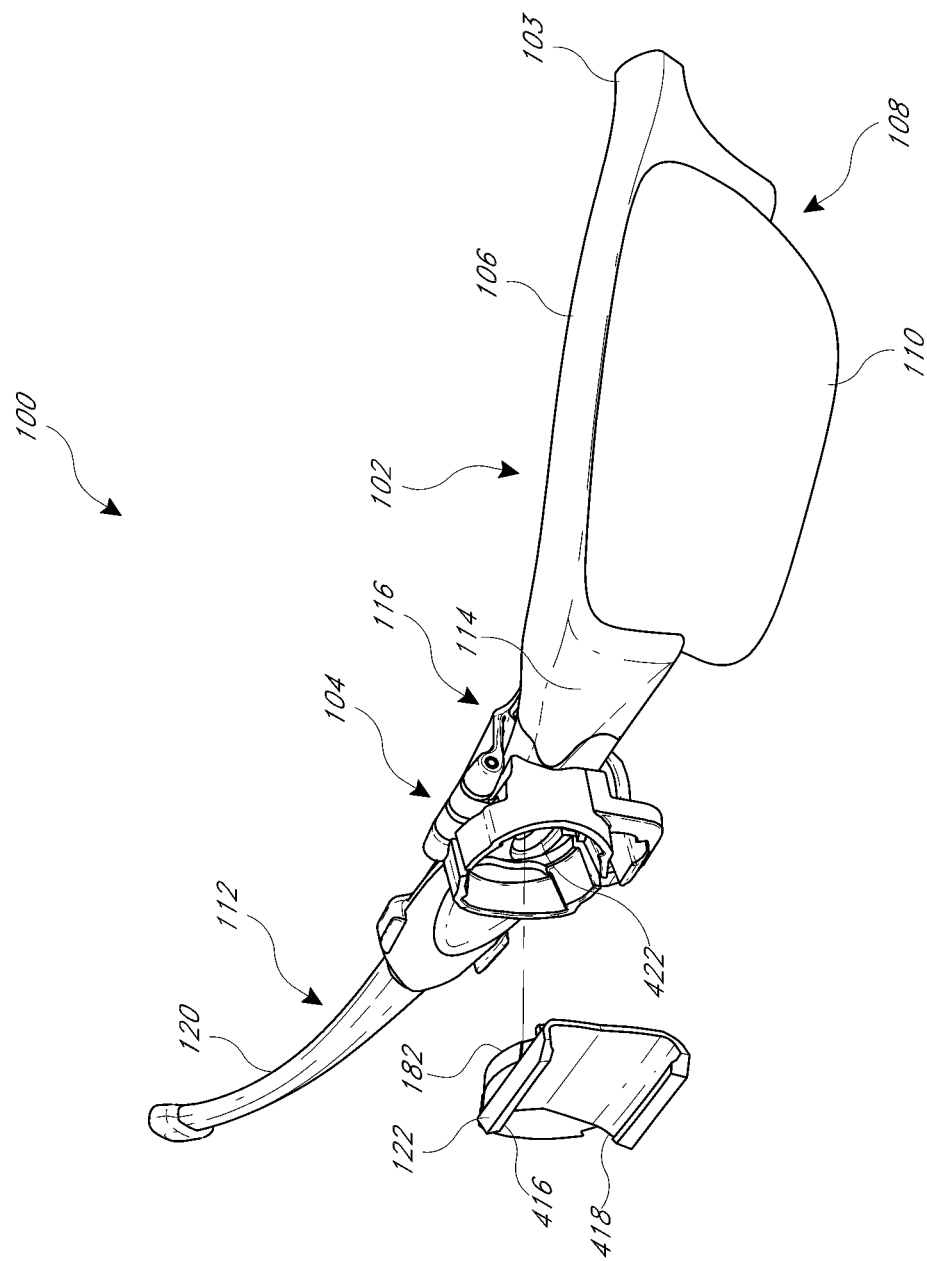
FIG. 4 is a perspective partial plan view of a detachable module and a connector assembly.

FIG. 4 is a perspective partial plan view of the detachable module 104 and the connector assembly 122. The connector assembly 122 may be a semi-rigid assembly that includes grip 416, grip 418, and/or a coupling device 182. The connector assembly 122 is illustrated as being separate from the support 102 for the purposes of clarity.

In an embodiment, the grips 416 and 418 support the second module 146. For example, the grips 416 and 418 may flex to allow the second module 146 to be held therebetween by tension in grips 416 and 418 and/or by friction created by the abutting surfaces of the grips 416 and 418 and the second module 146.

The connector assembly 122 may couple to the detachable module 104 via the coupling device 182. For example, a surface of the coupling device 182 is pressed toward or against a surface 422 of the detachable module 104. The coupling device 182 and the surface 422 may operate as a magnetic clasp. The coupling device 182 may be a magnet, a mount, a button, a clip, a clip-on, tape, or the like. The coupling device 182 may be integrated into the connector assembly 122.

Figure 5:
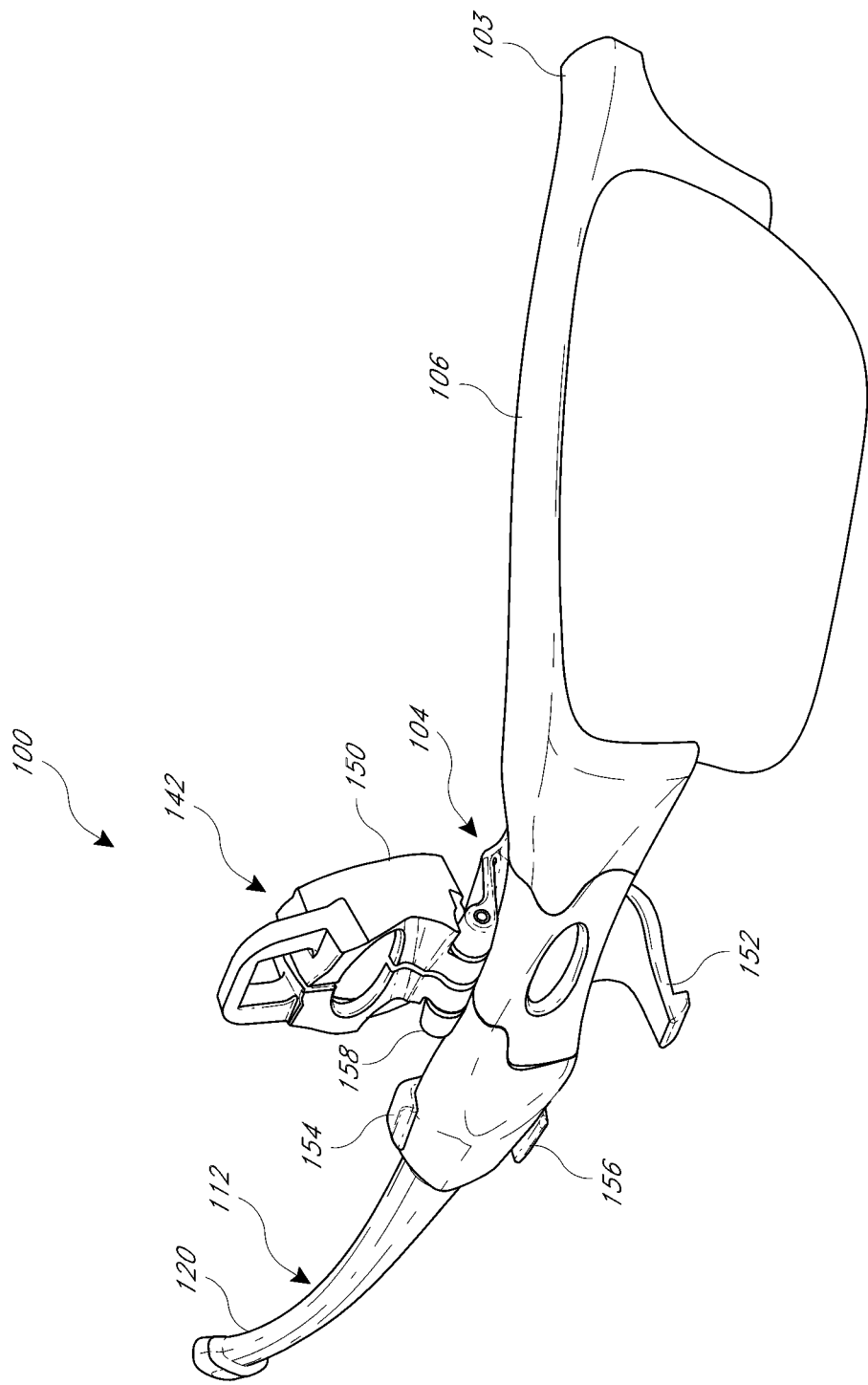
FIG. 5 is a perspective partial plan view of the detachable module of FIG. 4 prior to complete installation on the support assembly of FIG. 1.
Figure 6:
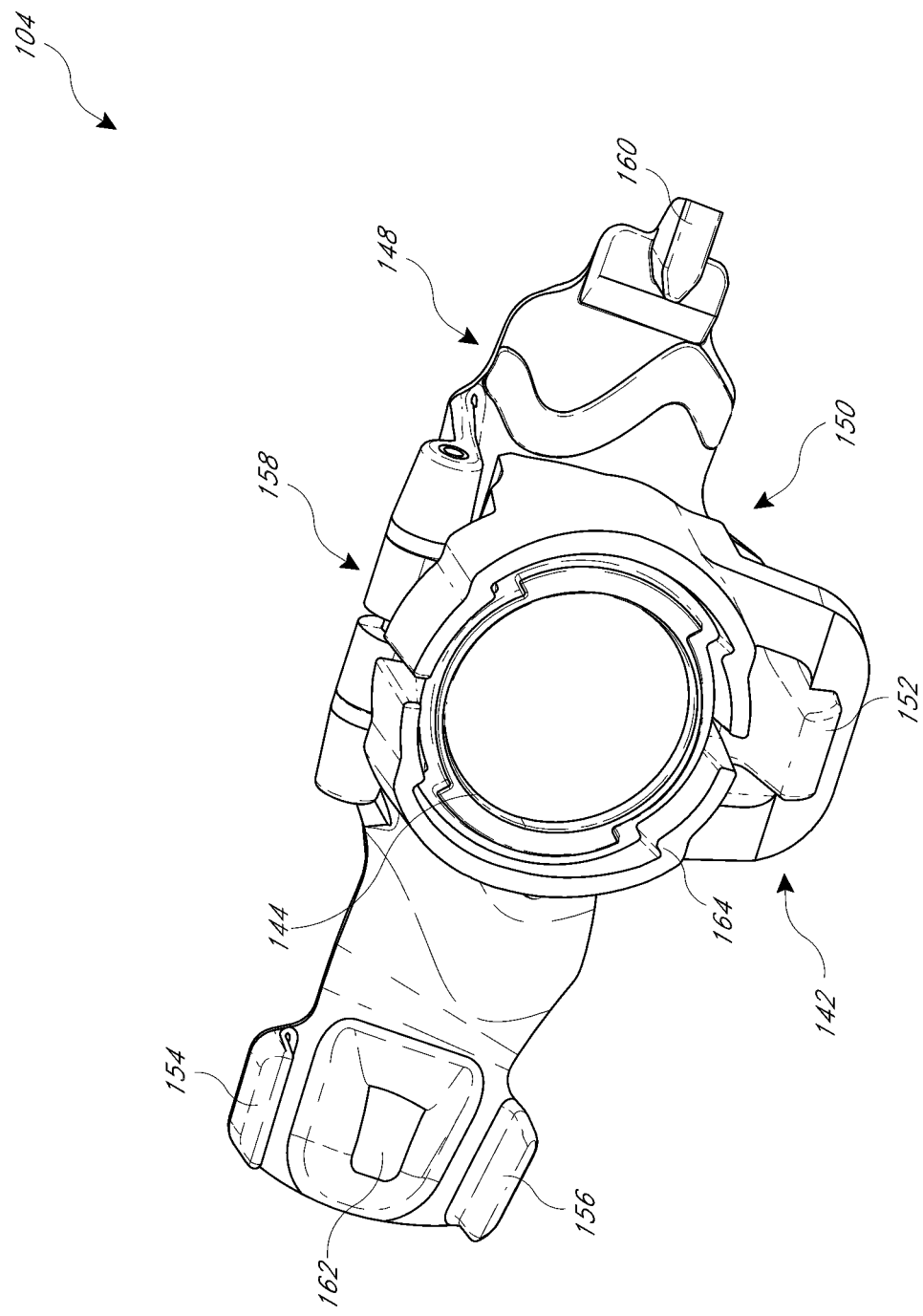
FIG. 6 is a perspective view of a detachable module in accordance with one embodiment of the present disclosure.
Figure 7:
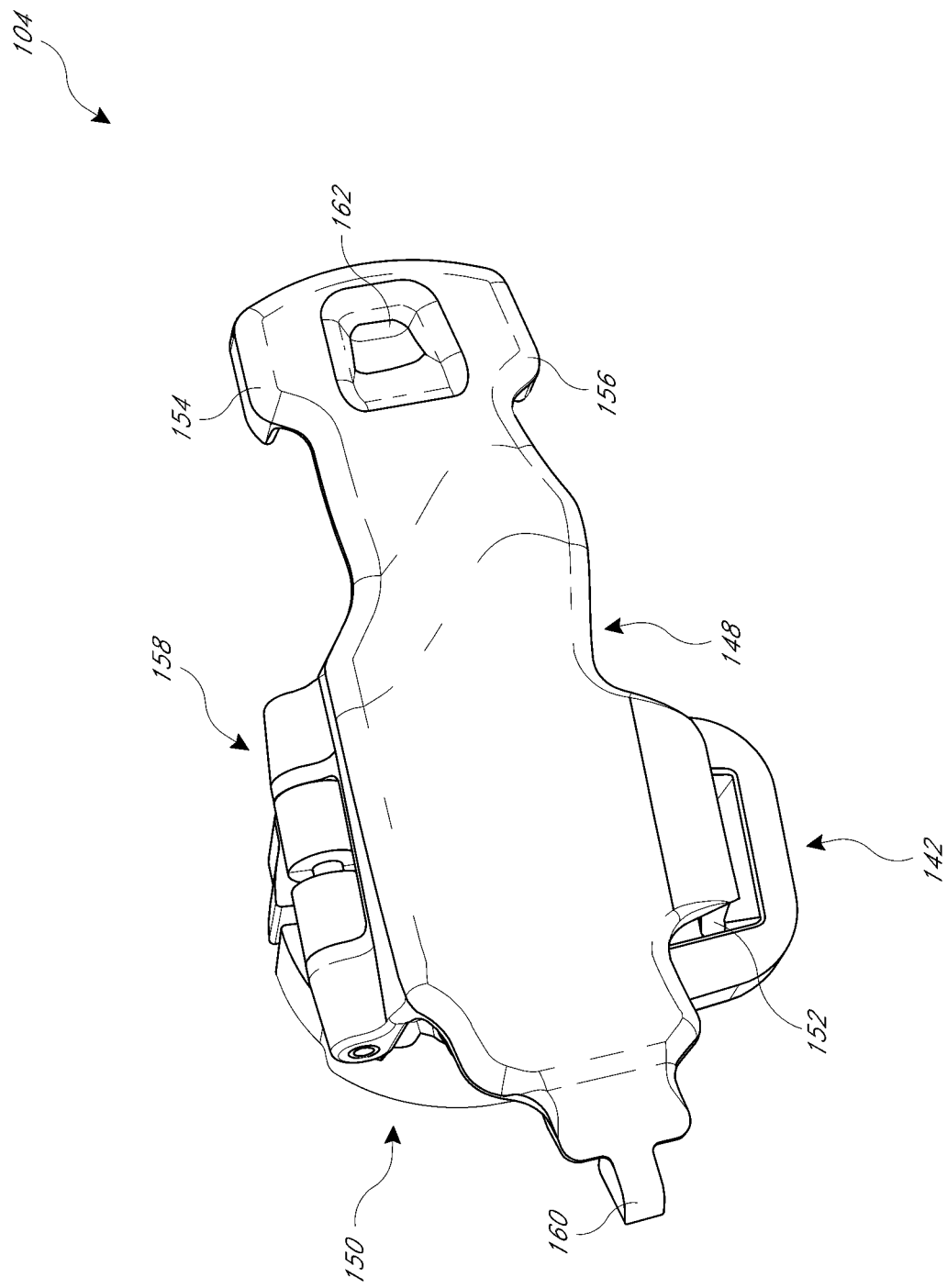
FIG. 7 is another perspective view of the detachable module of FIG. 6.
Figure 8:
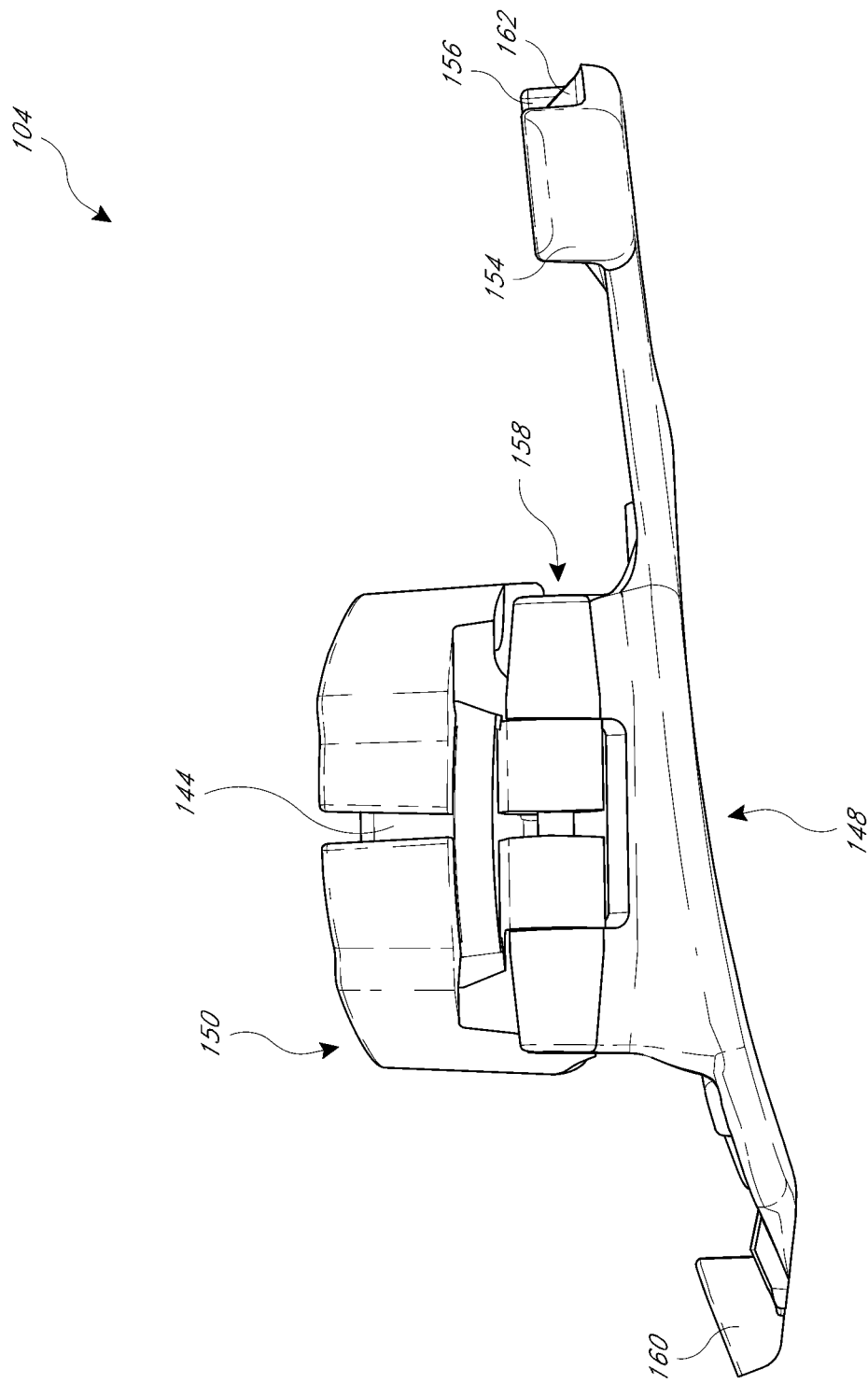
FIG. 8 is a top view of the detachable module of FIG. 6.
Figure 9:
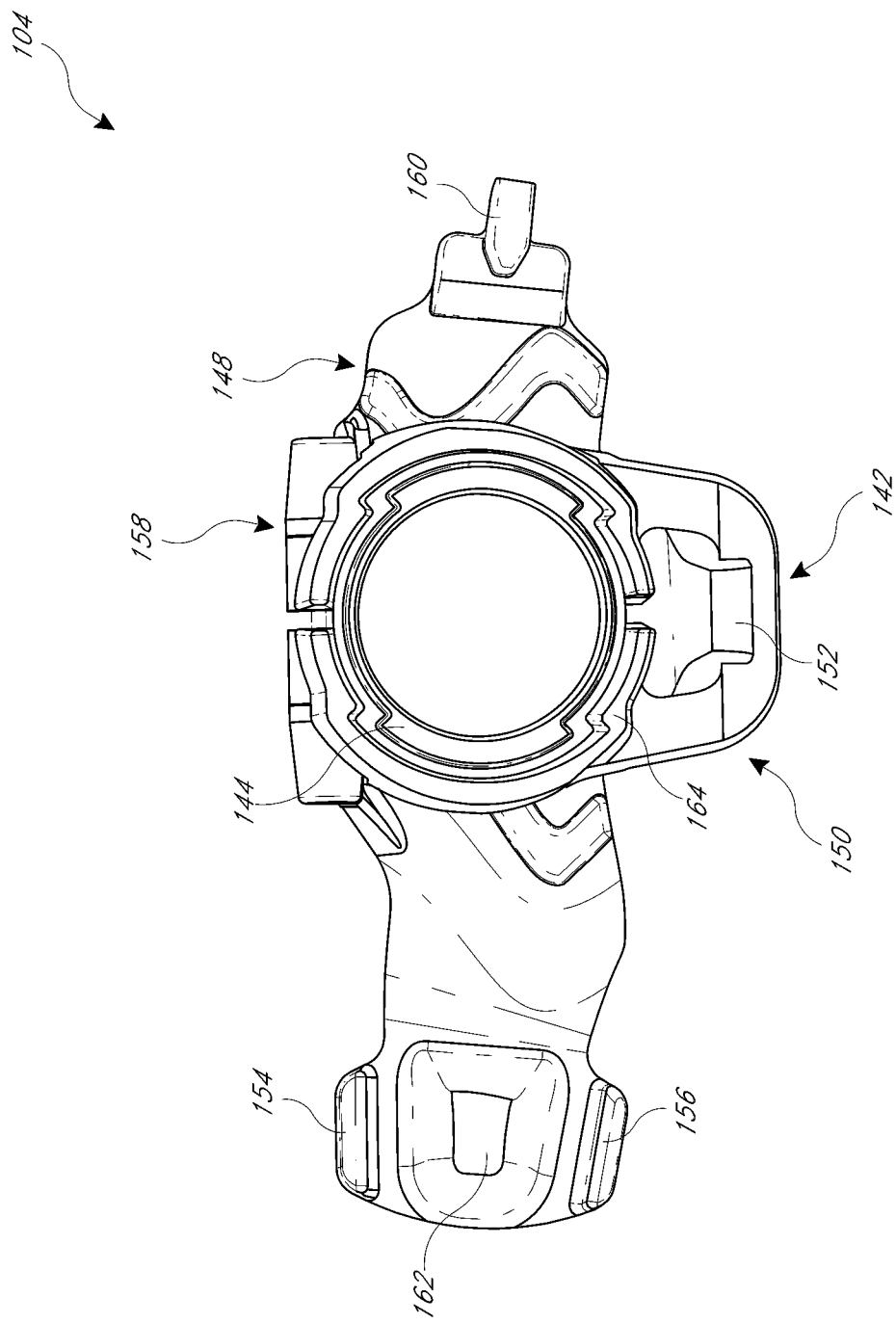
FIG. 9 is a side view of the detachable module of FIG. 6.
Figure 10:
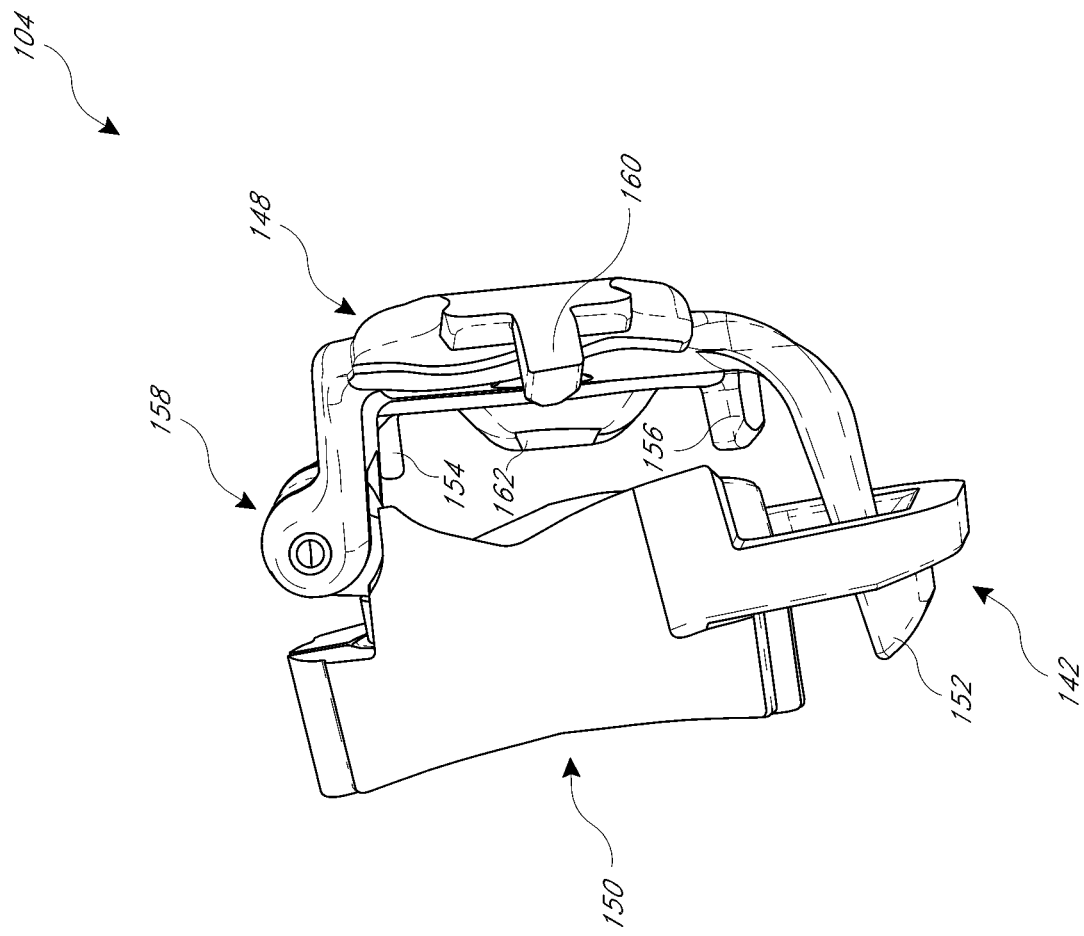
FIG. 10 is an end view of the detachable module of FIG. 6.
Figure 11:
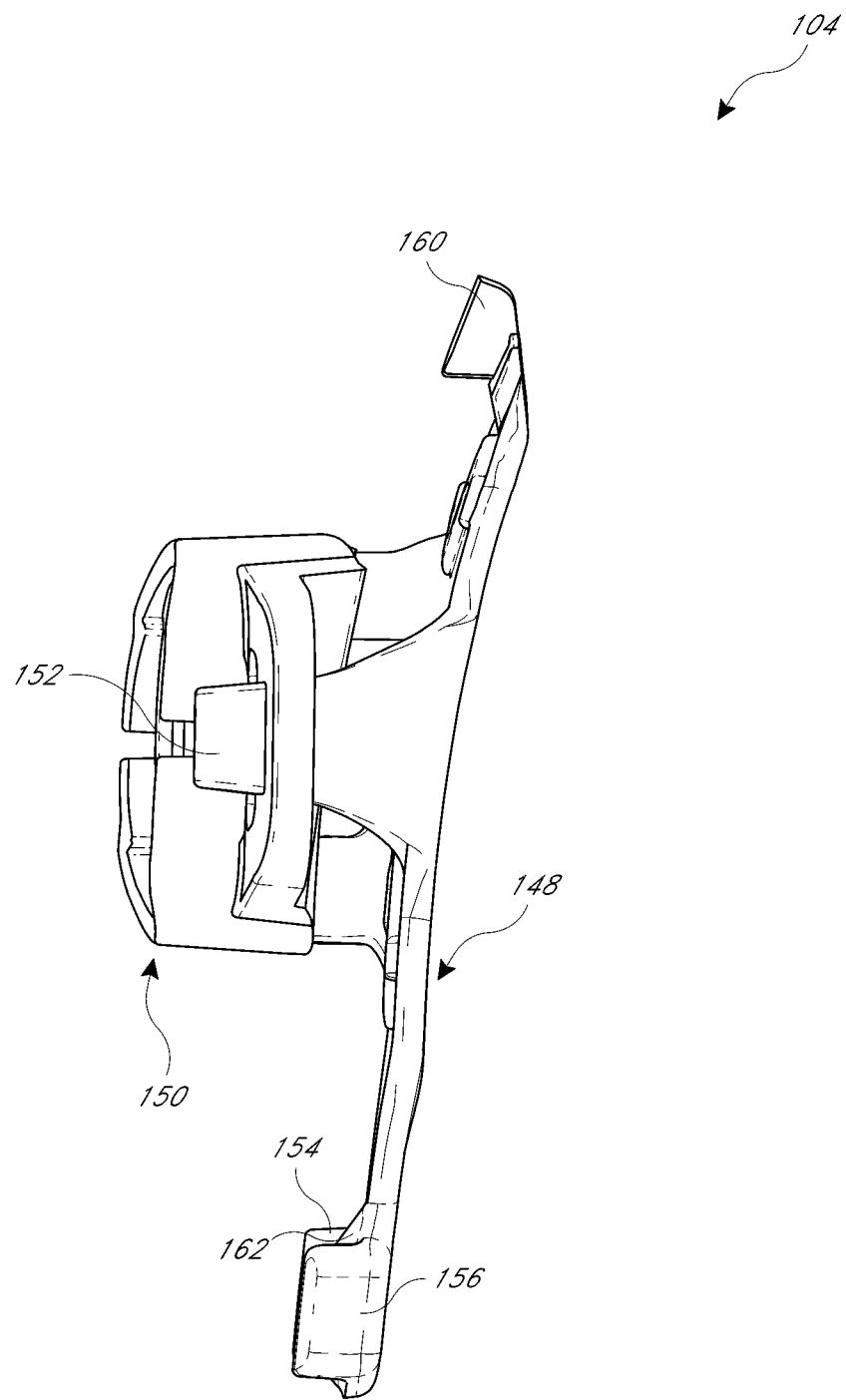
FIG. 11 is another end view of the detachable module of FIG. 6.

FIG. 5 is a perspective partial plan view of the detachable module 104 prior to complete installation on the support assembly 100. As described in greater detail below, the detachable module 104 includes a first coupling 142 (e.g., a flexible region), a second plate 150, a lip 152 (e.g., a hook), a top lip 154, a bottom lip 156, a hinge 158. These components cooperate as a fold over clasp that operate by wrapping about support member 112. The first coupling 142 may include the lip 152. The coupling of the detachable module 104 to the support member 112 may be temporary or permanent. In an embodiment, top lip 154 and bottom lip 156 provide or receive one or more contact surfaces of the support member 112 without marring the support member 112.

The detachable module 104 may include any structure that couples to a second plate via a hinge and provides a portion of a first coupling that holds the second plate in a closed position, thereby grasping an support member. For example, the detachable module 104 may include cylindrical barrels, such as the cylindrical barrels 310 and 312 that are discussed below with reference to FIG. 12, and the lip 152. As described in greater detail below, the detachable module 104 may include conventional surfaces and surface features to reduce the possibility of movement of the detachable module 104 along a length of the support member 112.

In an embodiment, the second plate 150 includes any component of a detachable module that cooperates with the top lip 154 and the bottom lip 156 to wrap about the support 102 and/or close the detachable module 104. For example, the second plate 150 cooperates with the other components of the detachable module 104 to provide an open position and a closed position of the fold over clasp of the detachable module 104.

In an embodiment, to mechanically couple the support member 112 and the detachable module 104 with the fold over clasp in an open position, the detachable module 104 is brought into contact with an inner surface of the support member 112. The second plate 150 may be moved in an arc on hinge 158 until a surface of the first coupling 142 is caught by the lip 152 to latch the second plate 150 in the closed position of the fold over clasp (e.g., to latch the second plate 150 to a first plate 148, as described in greater detail below). The lip 152 may flex when urged into position onto a surface of the first coupling 142. With the second plate 150 in the closed and latched position, the detachable module 104 and support member 112 are mechanically coupled (e.g., assembled, fixed, rigidly mounted, friction fitted, bound together, etc.). Adhesives may additionally be used to bond the detachable module 104 to the support member 112.

In another embodiment, not shown, the support member 112 is formed to include a portion of the hinge 158 and a portion of the first coupling 142. Thus, the top lip 154 and the bottom lip 156 may be omitted. The remainder of the hinge 158 and the remainder of the first coupling 142 may be part of the second plate 150.

In an embodiment, when the detachable module 104 is brought against the support member 112 without adhesives therebetween, the detachable module 104 is easily removed from the support member 112 by lifting the lip 152 away from first coupling 142 to allow the second plate 150 to move in an arc about hinge 158 and then be moved away from the support member 112. In another embodiment, in addition to or in place of the lip 152, the detachable module 104 may be coupled to the support member 112 in any conventional manner (e.g., screws, snaps, ties, grips, etc.).

One embodiment of a detachable module 104 is illustrated in FIGS. 6-13. The detachable module 104 includes a first plate 148, the second plate 150, the first coupling 142, and a second coupling 144. The plates as referred to herein (e.g., first plate 148 and second plate 150) can also be referred to as housings, clipped portions, or supports. The first plate 148, the second plate 150, and the first coupling 142 allow the detachable module 104 to be removably connected to the support member 112 of support 102 of the support assembly 100. As is described in greater detail below, the first plate 148 and the second plate 150 can be coupled at one end with the hinge 158. In other embodiments, not shown, the first plate 148 and the second plate 150 can be coupled at one end using any known connection device. In an embodiment, the first plate 148 rests against the support member 112, such as against the rail 118, on a side closer to the wearer. The first plate 148 includes the lip 152 (e.g., a hook) that can secure the first plate 148 to the second plate 150 at a second end. The second plate 150, which rests against the support member 112, such as against the rail 118, on a side farther from the wearer, includes an opening in which the lip 152 can be inserted to form the first coupling 142.

While FIGS. 6-13 illustrate a lip 152, the first coupling 142 can include any of a variety of locking mechanisms to allow opening and closing of the first coupling 142. The first plate 148 is movable with respect to the second plate 150 when the locking mechanism is released. Such moveability of the first plate 148 and the second plate 150 allow the first coupling 142 to at least partially surround and enclose a portion of a rail (not shown), such as rail 118 described above. In addition, the locking mechanism can be released to remove the first coupling 142 from the rail.

In an embodiment, the first plate 148 can be molded to fit securely against a portion of the support member 112, such as against the rail 118. For example, the first plate 148 can include a top lip 154 and a bottom lip 156, where the top lip 154 rests against the top of a portion of the support member 112 and the bottom lip 156 rests against the bottom of a portion of the support member 112. As another example, the first plate 148 can include a tab 160 that can be inserted into the support member 112. As another example, the first plate 148 can include an area (e.g., a convex indentation 162) that can rest against a complementary area (e.g., a concave indentation) of the support member 112. The top lip 154, the bottom lip 156, the tab 160, and/or the convex indentation 162 can help support the detachable module 104 and hold it in place. Likewise, the second plate 150 can also be molded to fit securely against a portion of the support member 112, such as against the rail 118. As illustrated in at least FIGS. 5-11, 13-15, and 23, the top lip 154, the bottom lip 156, the tab 160 and the convex indentation 162 are non-limiting embodiments of protrusions. These protrusions can, in some embodiments, inhibit rotation of the first connector.

In one embodiment, the detachable module 104 also includes the second coupling 144 that allows the detachable module 104 to be removably connected to the second module 146, such as, for example, a camera. In an embodiment, the second coupling 144 is embedded in a housing of the second plate 150. The second coupling 144 can be molded into the housing or can be removably coupled to the housing. For example, the second coupling 144 can be a magnet that is removably coupled to the housing. In one embodiment, the second coupling 144 is secured in the housing of the second plate 150 without any adhesive material. For example, the housing can be of a general circular shape, but can include indentations, such as indentation 164, that are complementary to indentations included in the second coupling 144, such that the second coupling 144 can mechanically lock into place in the housing of the second plate 150.

Figure 12:
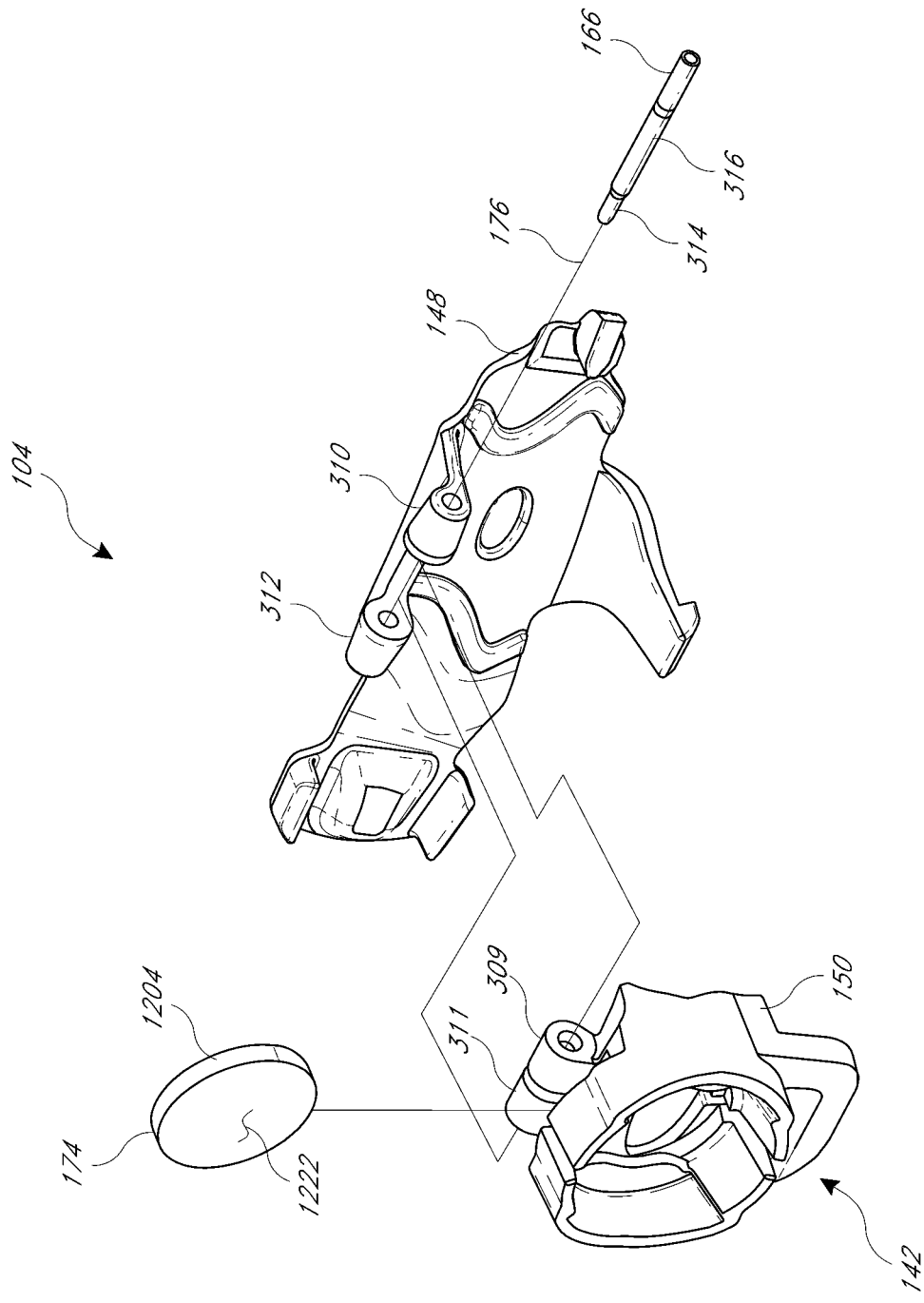
FIG. 12 is a perspective exploded view of the detachable module of FIG. 4.
Figure 13:
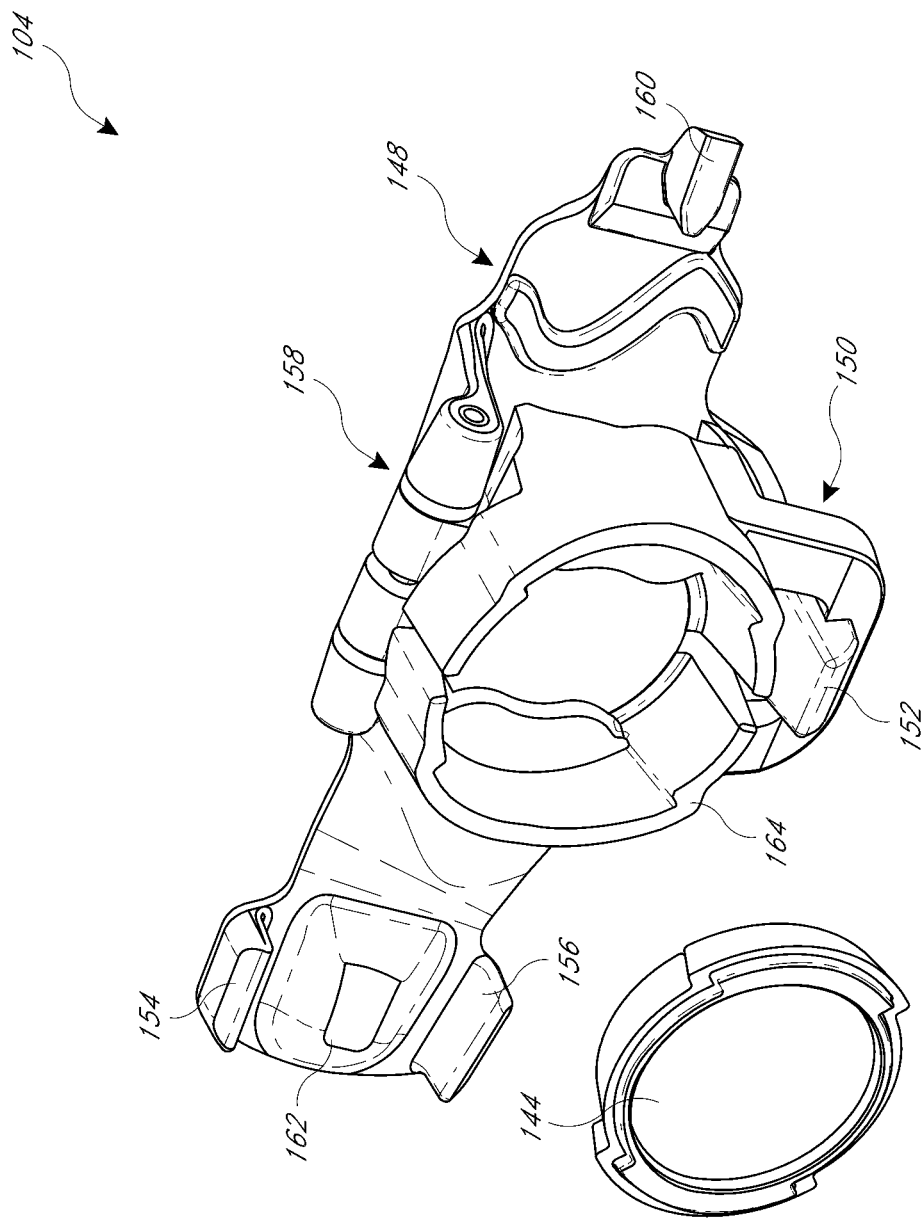
FIG. 13 is another perspective view of the detachable module of FIG. 6.

As illustrated in FIG. 12, the detachable module 104 further includes a sheet 174 (e.g., a cylindrical wafer) and a pin 166. The sheet 174 may include, or be formed of, material having magnetic permeability greater than the magnetic permeability of the material from which the remainder of the second plate 150 is made. Conventional material of higher magnetic permeability may be substantially heavier than conventional materials for forming the second plate 150. By reducing the size of the portion of the second plate 150 having higher magnetic permeability, low density material (e.g., plastic) may be used to form the majority of the second plate 150 to reduce the overall weight of the second plate 150. In an embodiment, the sheet 174 includes unmagnetized steel for low cost construction. In another embodiment, the sheet 174 includes a conventional magnet having a magnetic pole on one circular face (e.g., surface 1222) of its cylindrical form and an opposite magnetic pole on the opposite face (e.g., surface 1204).

The second plate 150 may further include a cylindrical barrel 311 and a cylindrical barrel 309 formed integrally with the second plate 150. The first plate 148 may further include the cylindrical barrel 310 and the cylindrical barrel 312 formed integrally with the first plate 148. When the central axes of barrels 309, 310, 311, and/or 312 are aligned on central longitudinal axis 176 of the pin 166, the pin 166 passes axially through bores in barrels 309, 310, 311, and/or 312 in sequence to form the hinge 158. The interior diameters of axial bores in barrels 309, 310, 311, and/or 312 pass around or bind a diameter of the pin 166 as needed to accomplish the function of the hinge 158 discussed above and to maintain the pin 166 in position after assembly of the hinge 158. An end portion 314 of the pin 166 may have a smaller diameter than a central portion 316 of the pin 166 so that the pin 166 binds in the barrel 312. In a similar manner, the pin 166 may also bind in the barrel 310.

In another embodiment, not shown, the pin 166 is omitted. The barrels 309 and 311 may each instead be designed with a circularly symmetric, axially aligned post or bump facing barrels 310 and 312 respectively in place of the axial bores. Consistent design of the barrels 310 and 312 admits the posts or bumps to form hinge 158. The barrels 309 and 311 may be compressed together to facilitate alignment and assembly into the barrels 310 and 312. Residual tension in the first plate 148 and/or the second plate 150 maintains this alignment. The hinge 158 in this embodiment may be stiffer to operate than in the embodiment discussed above that included the pin 166. Compression and tension may be facilitated by slot 434 and the first coupling 142, as discussed below with respect to FIGS. 16-17.

Figure 14:
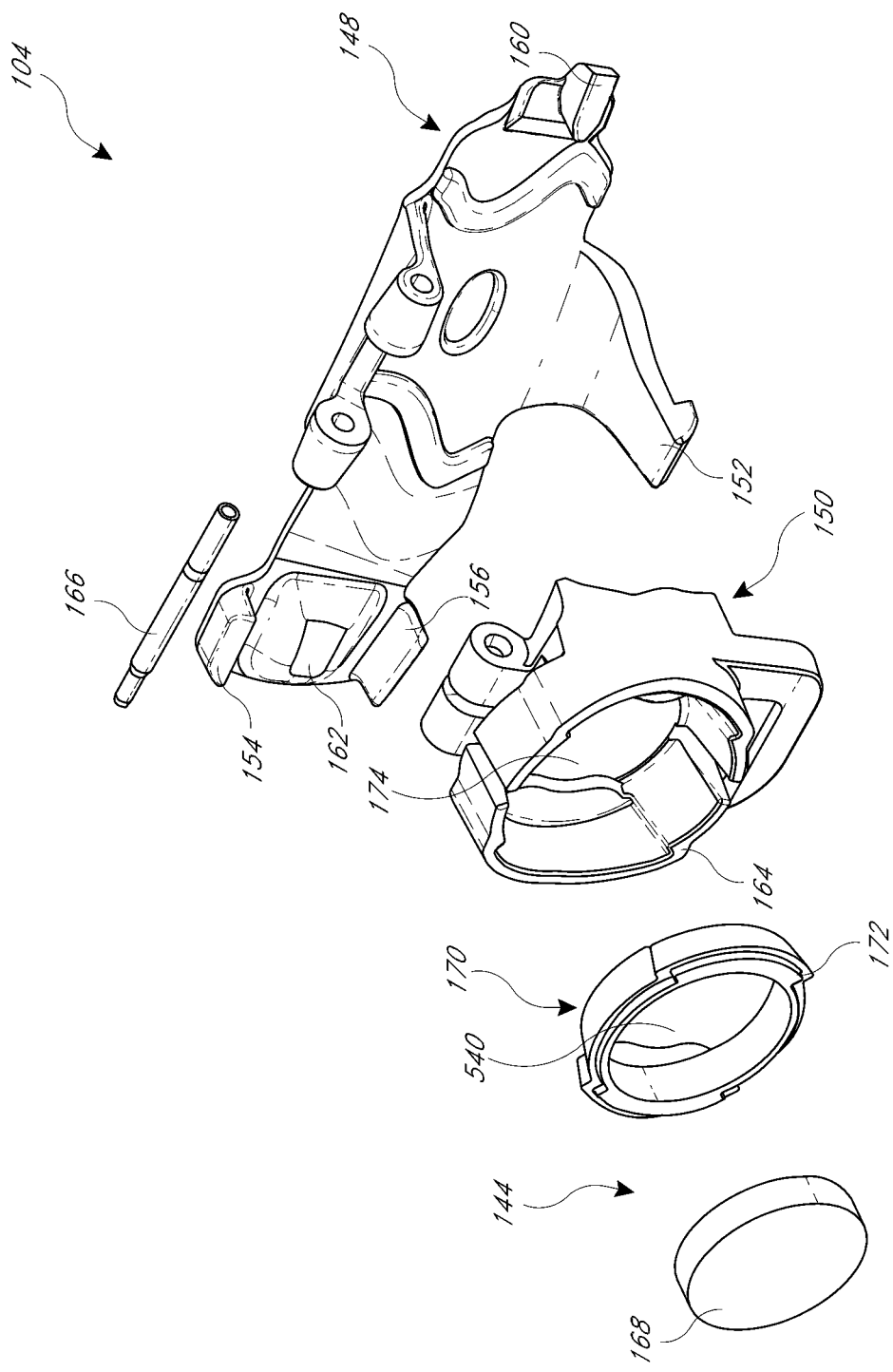
FIG. 14 is an exploded view of the internal assembly of the detachable module of FIG. 6.
Figure 15:
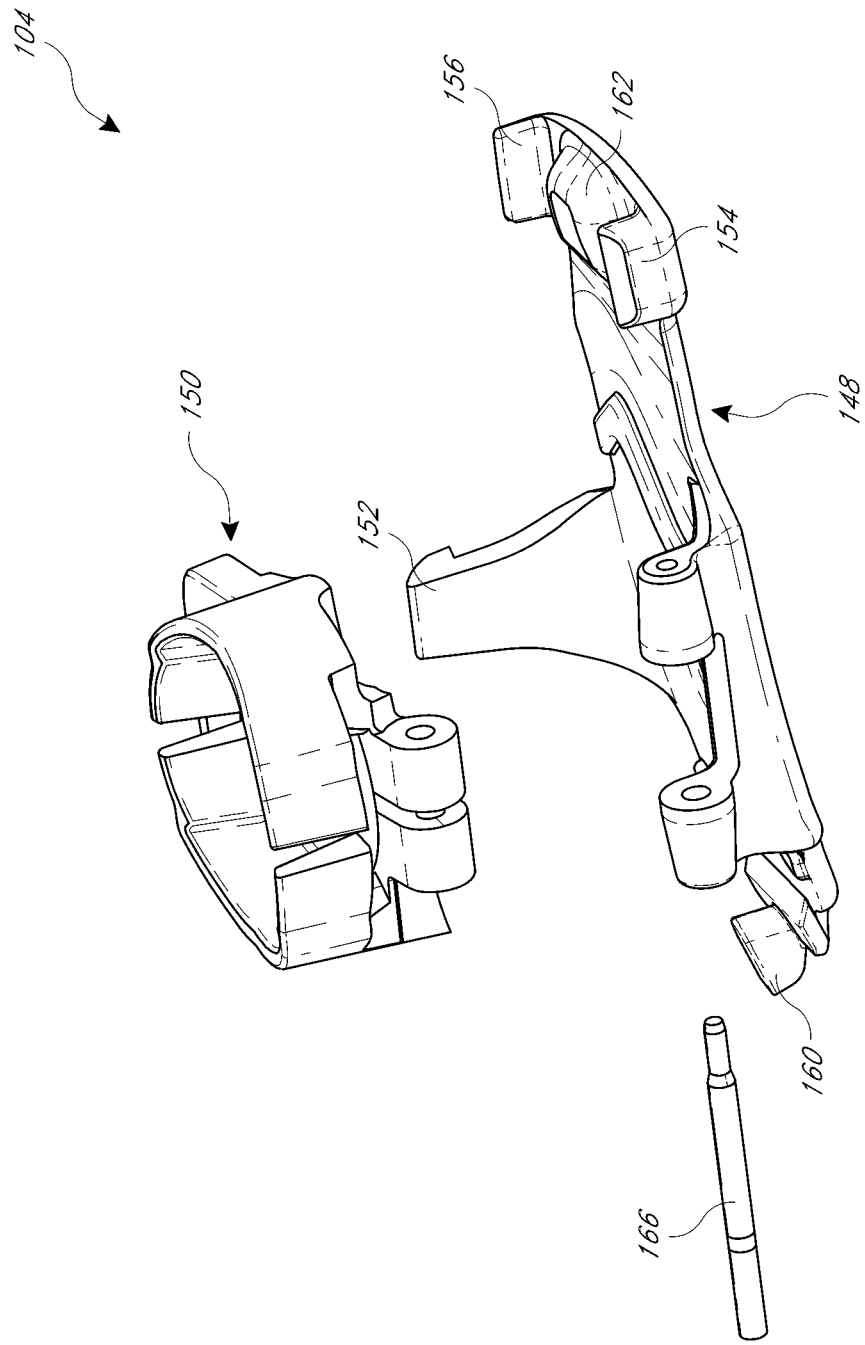
FIG. 15 is another exploded view of the internal assembly of the detachable module of FIG. 6.

An exploded view of one implementation of detachable module 104 is illustrated in FIGS. 14-15. The detachable module 104 includes the first plate 148, which includes a housing in which pin 166 can be placed. The detachable module 104 also includes the second plate 150, which includes the second coupling 144 and a housing in which pin 166 can be placed. Pin 166 hingably connects the first plate 148 with the second plate 150.

In an embodiment, the second plate 150 includes an interior cavity in which the second coupling 144 is placed. The second coupling 144 includes a coupling device 168 and a coupling device housing 170. For example, the coupling device 168 can be a magnet and the coupling device housing 170 can be any magnetic or non-magnetic structure. In some embodiments, the coupling device 168 and the coupling device housing 170 are molded to produce a unitary or monolithic module. In other embodiments, the coupling device 168 and the coupling device housing 170 are separate structures and may be coupled using any known methods. The coupling device housing 170 can include one or more indentations 172 that correspond to the one or more indentations 164 of the second plate 150. In one embodiment, the coupling device housing 170 can lock into the second plate 150 via the one or more indentations 172 and the one or more indentations 164. In other embodiments, the coupling device housing 170 is permanently affixed to the second plate 150. Note that in still further embodiments, the coupling device 168 and/or the coupling device housing 170 may be affixed to the housing 180.

In an embodiment, the interior cavity of the second plate 150 also includes a sheet 174. In an embodiment, the sheet 174 is mechanically secured inside the second plate 150. As an example, the sheet 174 can be a magnet with an opposite polarity of the coupling device 168 and/or the coupling device housing 170. The magnetic force may be sufficient to hold the coupling device housing 170 to the second plate 150.

Figure 16:
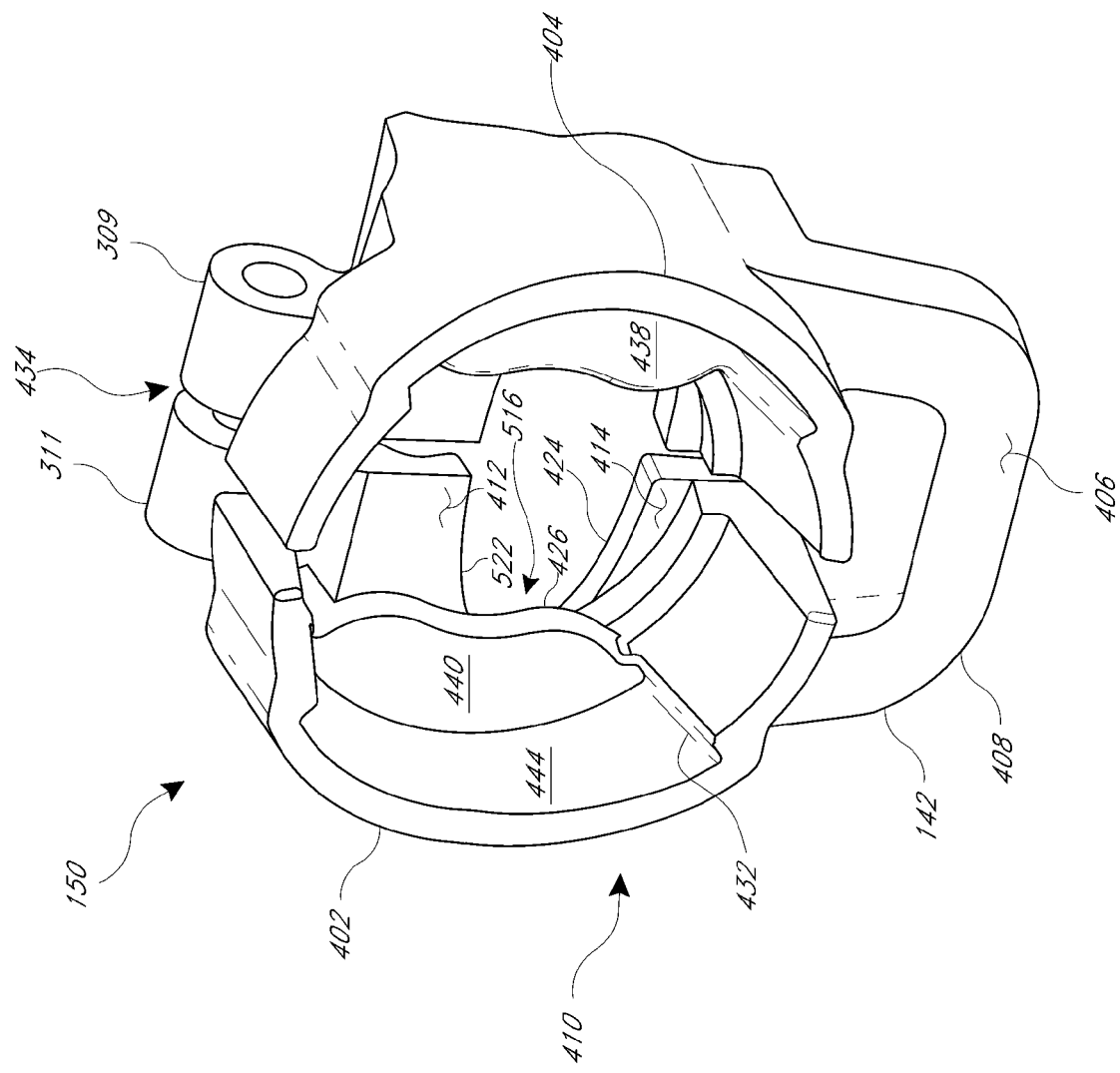
FIG. 16 is a perspective front plan view of a second plate of the detachable module of FIG. 4.

FIG. 16 is a perspective front plan view of the second plate 150 of the detachable module 104 of FIG. 4. As illustrated in FIG. 16, the second plate 150 includes left portion 402, right portion 404, surface 406 the first coupling 142, bar 408, and a cup shape having an interior 410. The terms "left" and "right" are arbitrary as to any convenient orientation of the second plate 150 (e.g., any portions on opposite sides of a central axis constitute "left" and "right" portions). Left portion 402 and right portion 404 have symmetrically arranged components protruding into interior 410. The components of the left portion 402 include rear wall 522 having front surface 412, rear wall 424 having front surface 414, and front wall 426 having rear surface 516. In addition, interior 410 includes surfaces 444 and 432 and retention features 440 and 438 that abut corresponding surfaces of the connector assembly 122 to locate the connector assembly 122 in interior 410 and to align the second module 146 with respect to the second plate 150. As a consequence of the features of the detachable module 104 discussed above, the second module 146 is aligned with support member 112 and the field of view of the user.

Figure 17:
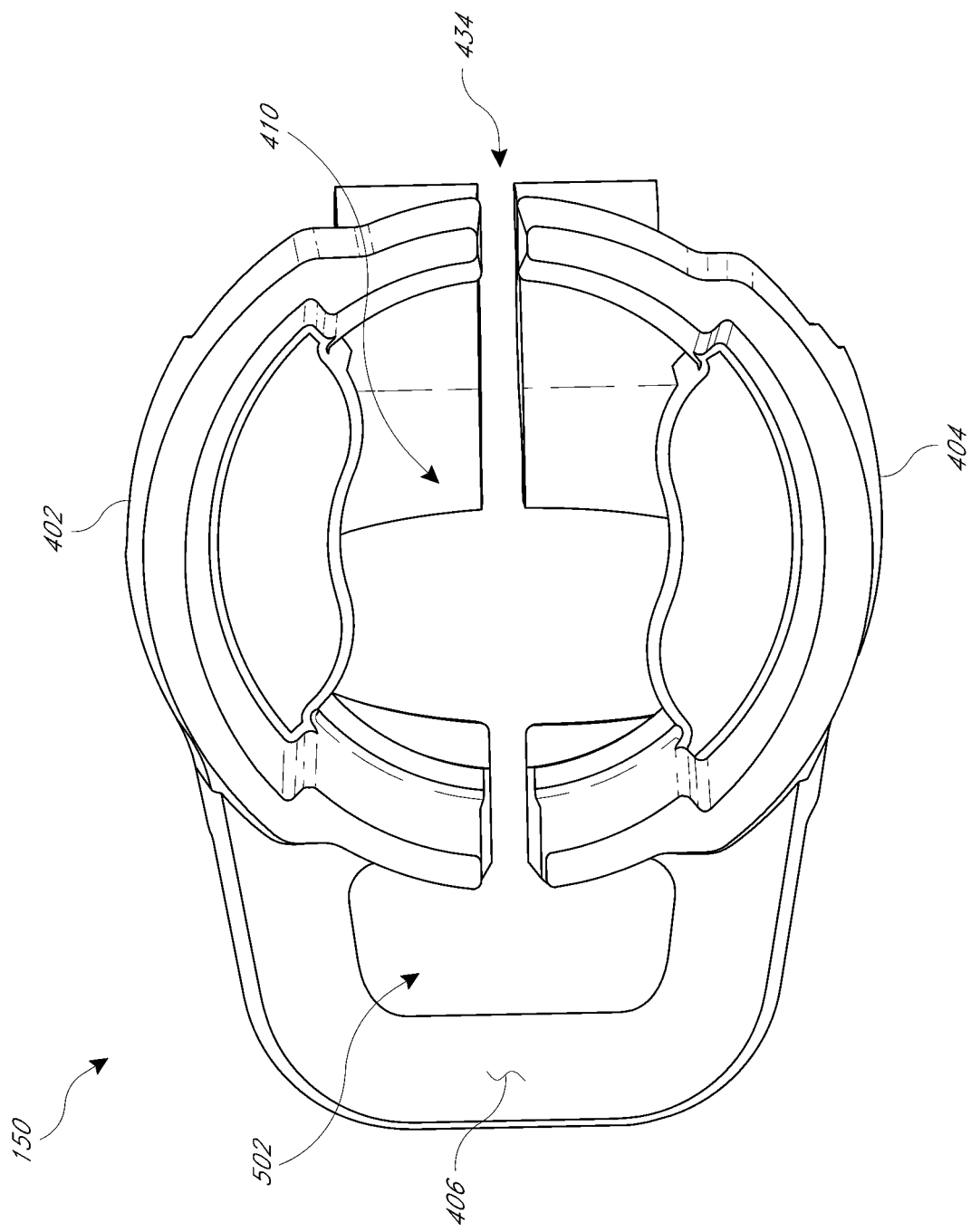
FIG. 17 is an isometric front view of the second plate of FIG. 16.
Figure 18:
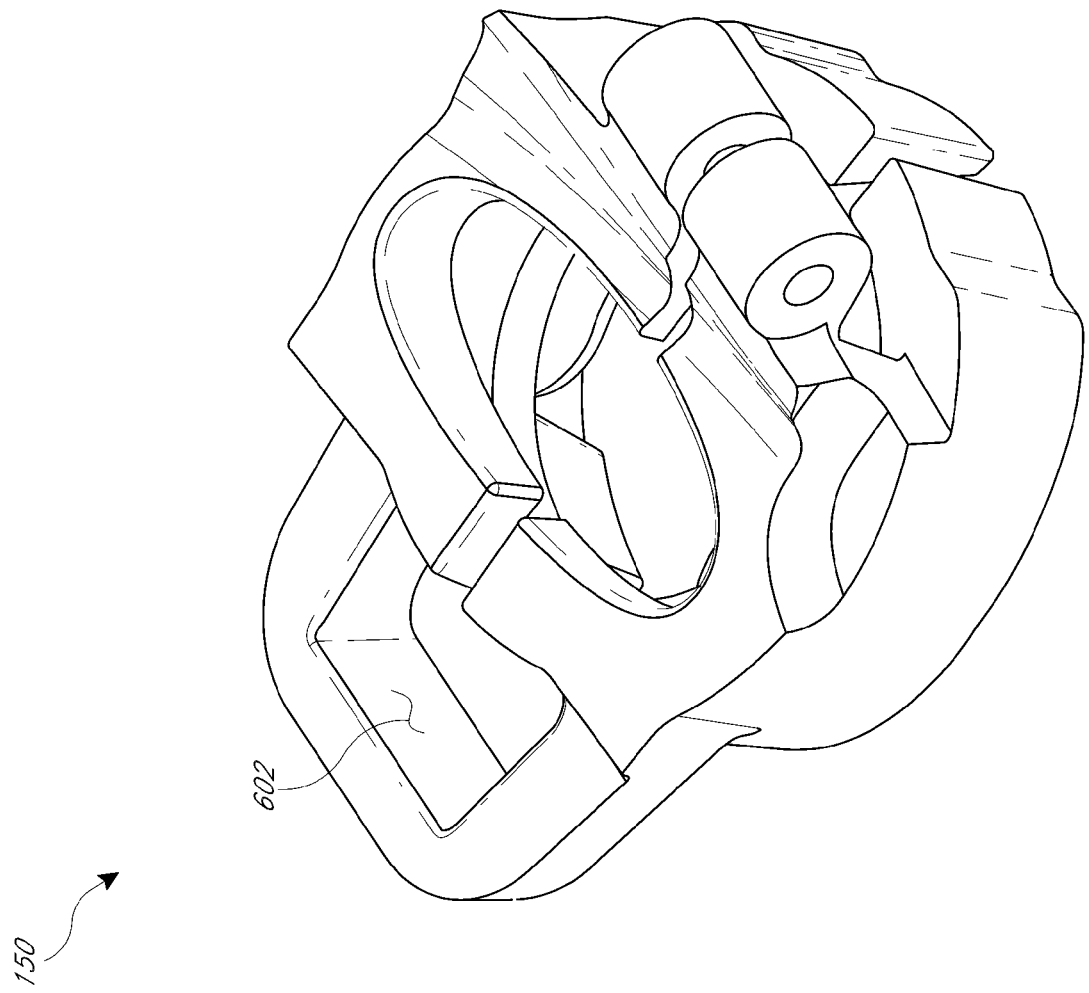
FIG. 18 is a perspective rear plan view of the second plate of FIG. 16.

In an embodiment, a portion of the cup shape of the second plate 150 may constitute any structure that permits spreading of a slot. The first coupling 142 may solely, or in concert with other features, join a left portion to a right portion. In addition, the first coupling 142 may provide one or more surfaces that constitute a portion of a latch. For example, the first coupling 142 includes the bar 408. The bar 408 joins the left portion 402 and the right portion 404. The left portion 402 and the right portion 404 define slot 434, as illustrated in FIGS. 16-17. The first coupling 142 may provide the surface 406 that, when the first plate 148 and the second plate 150 are in the closed, retains the lip 152. The first coupling 142 may also provide surface 602, as illustrated in FIG. 18. The lip 152 may slide on the surface 602 when the first plate 148 and the second plate 150 are transitioned from the open position to the closed position (e.g., when the second plate 150 is latch closed to create the fold over clasp).

In an embodiment, the slot 434 includes any free space for the movement of structural portions that include one or more flexible regions. The slot 434 may be central between generally symmetric portions. The slot 434 may include or define an orifice 502 facilitating the latching of the second plate 150 into a closed position, as illustrated in FIG. 17. For example, the slot 434 passes between the left portion 402 and the right portion 404 through a center of the interior 410 of the cup shape of the second plate 150. At one end of the slot 434, the orifice 502 provides space for the lip 152 to move into position onto surface 406.

Figure 19A:
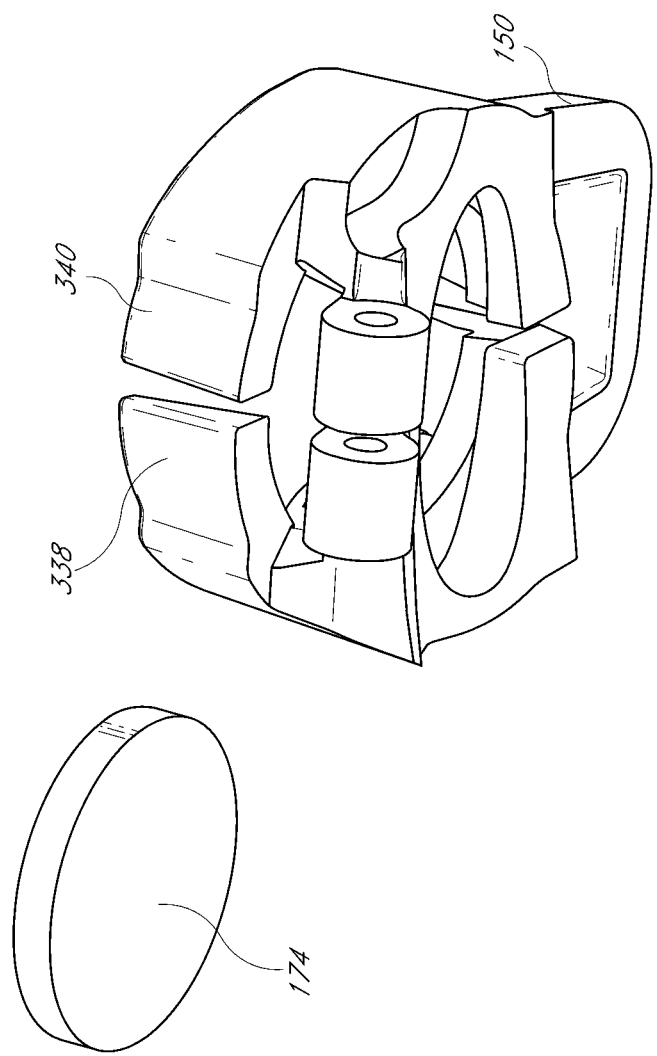
FIGS. 19A-19B show one aspect of the second plate of the detachable module of FIG. 6.

FIG. 19A illustrates the second plate 150 in greater detail. The second plate 150 may have a cavity or slot and retention feature(s) molded into it such that the sheet 174 may be inserted into the second plate 150. For example, the retention feature(s) may form the cavity. Lips 338 and 340 may define an opening of the cavity as the lips 338 and 340 may be spread apart to allow an object to be inserted into the cavity. The lips 338 and 340 may be spread apart or separated a distance equal to a diameter, length, and/or width of the sheet 174. The second plate 150 may contain retention features to hold the sheet 174 loosely or firmly in place. Lips 338 and 340, which may comprise part of the retention features, may be pulled apart such that the sheet 174 may be inserted into the second plate 150. In some embodiments, the sheet 174 may have a shape that conforms to or is the same as the shape of the volume of the cavity.

Figure 19B:
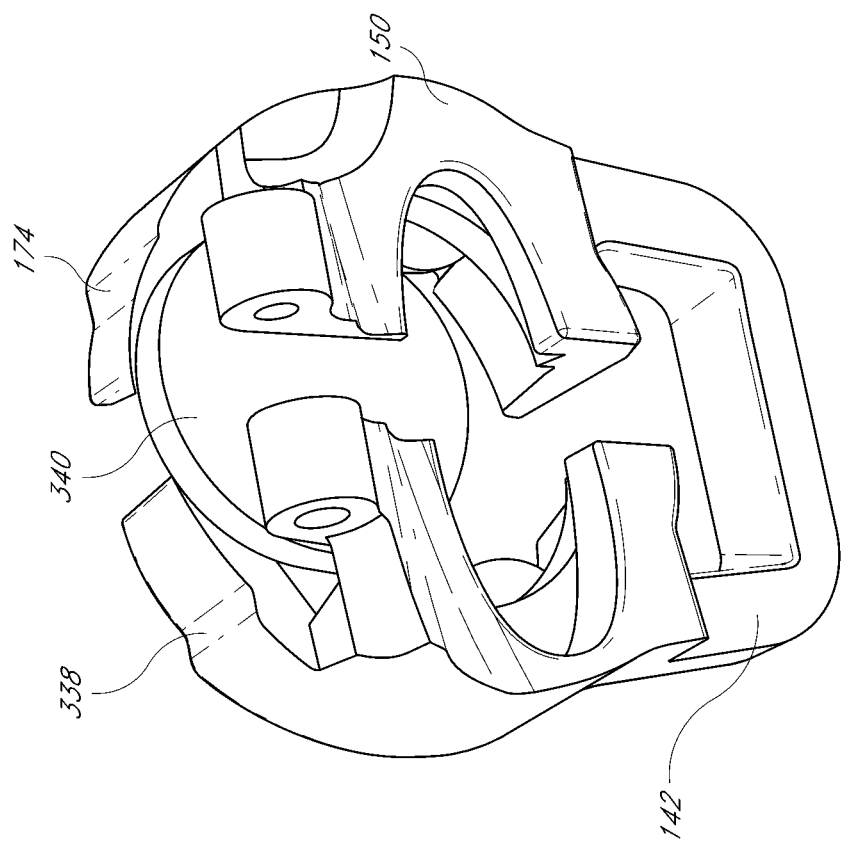

FIG. 19B illustrates the second plate 150 in greater detail. In FIG. 19B, lips 338 and 340 of the second plate 150 are pulled apart such that the sheet 174 can be inserted into the second plate 150. Note that the first coupling 142 may have an elastic of spring-like characteristic so that it can be deformed to the extent that the lips 338 and 340 may be pulled apart. In this way, the sheet 174 may be inserted into the second plate 150 without the use of glue or other types of fasteners (e.g., screws).

Figure 20A:
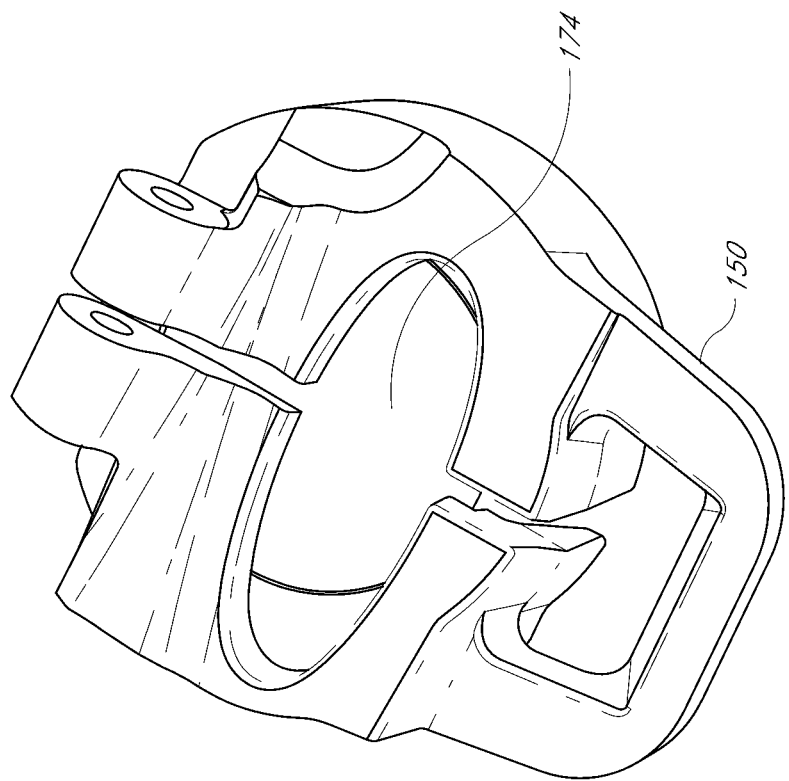
FIGS. 20A-20B show one aspect of the second plate of the detachable module of FIG. 6.
Figure 20B:
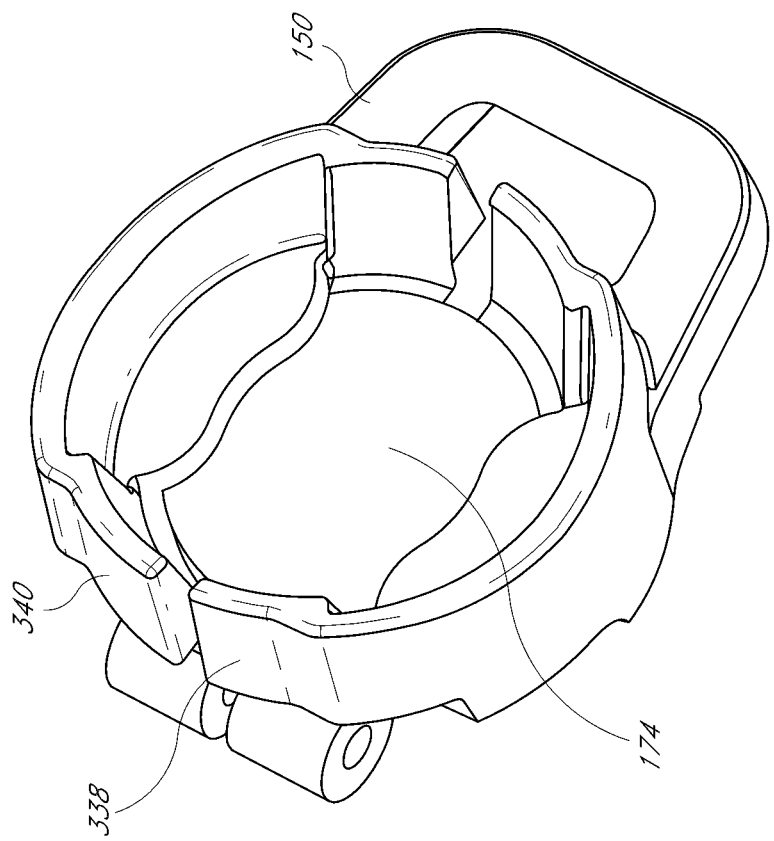

FIGS. 20A and 20B illustrate the second plate 150 in greater detail. In an embodiment, the sheet 174 may sit in place as the lips 338 and 340 revert to their normal positions as illustrated in FIG. 19A.

Figure 21A:
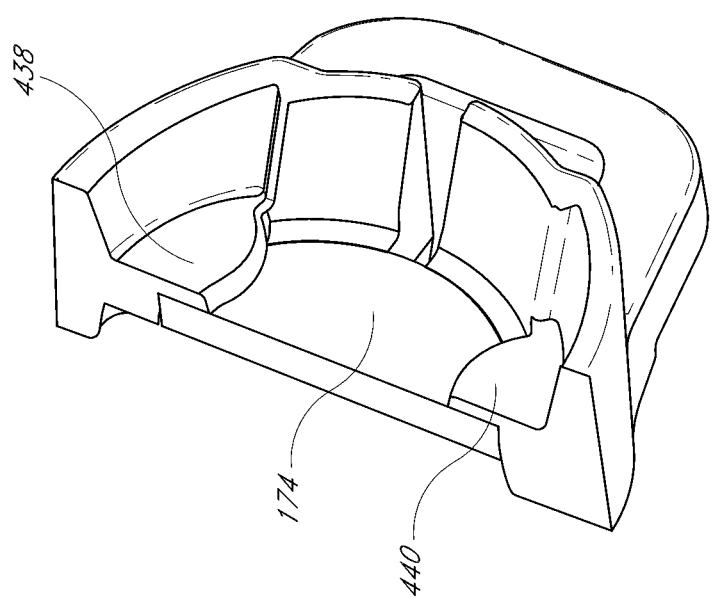
FIGS. 21A-21B show one aspect of the second plate of the detachable module of FIG. 6.
Figure 21B:
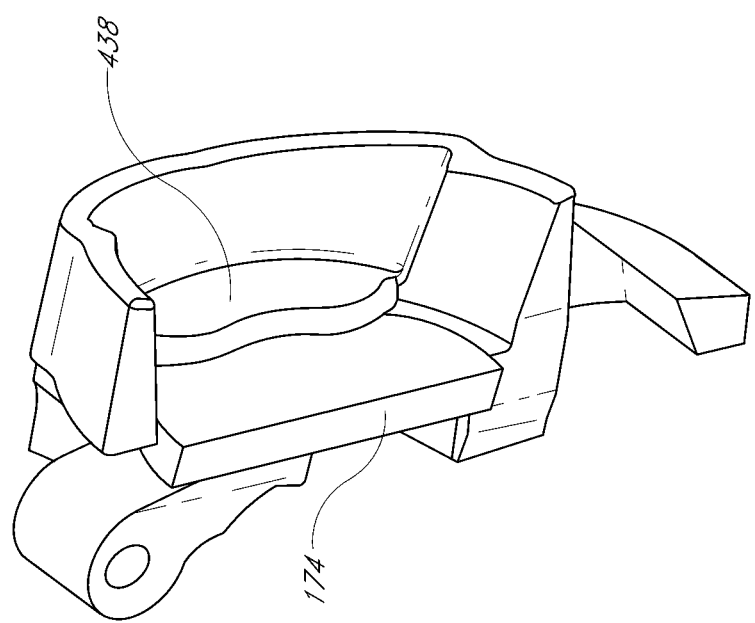

FIGS. 21A and 21B illustrate a cutaway view of the second plate 150. FIGS. 21A and 21B illustrate some of the retention features present in the second plate to loosely or firmly hold the sheet 174 in place. For example, retention feature 438 and retention feature 440 may rest against one side of sheet 174 such that sheet 174 is secure. In some embodiments, the retention features, such as 438 and/or 440 may couple with a barrier 540 (see FIG. 14) of the coupling device housing 170 such that the thickness of the material between the sheet 174 and the coupling device 168 is of a uniform thickness. For example, the retention features 438 and/or 440 may mate with the barrier 540 such that a thickness or amount of space between the sheet 174 and the coupling device 168 is equal to the thickness of one of the retention features 438 and/or 440 and/or the barrier 540. In other words, the retention features 438 and/or 440 may be of the same thickness as the barrier 540. The retention features 438 and/or 440 and the barrier 540 may be aligned with respect to each other so that when the sheet 174 is coupled to the coupling device 168, the retentions features 438 and/or 440 and the barrier 540 do not press against each other on their external faces, but instead are adjacent to each other laterally. The retention features 438 and/or 440 and the barrier 540 may interface in such a way that at any given location between the sheet 174 and the coupling module 168, only of the retention features 438 and/or 440 and the barrier 540 lies between the sheet 174 and the coupling module 168. In some embodiments, however, there may be no material between the sheet 174 and the coupling device 168.

Figure 22A:
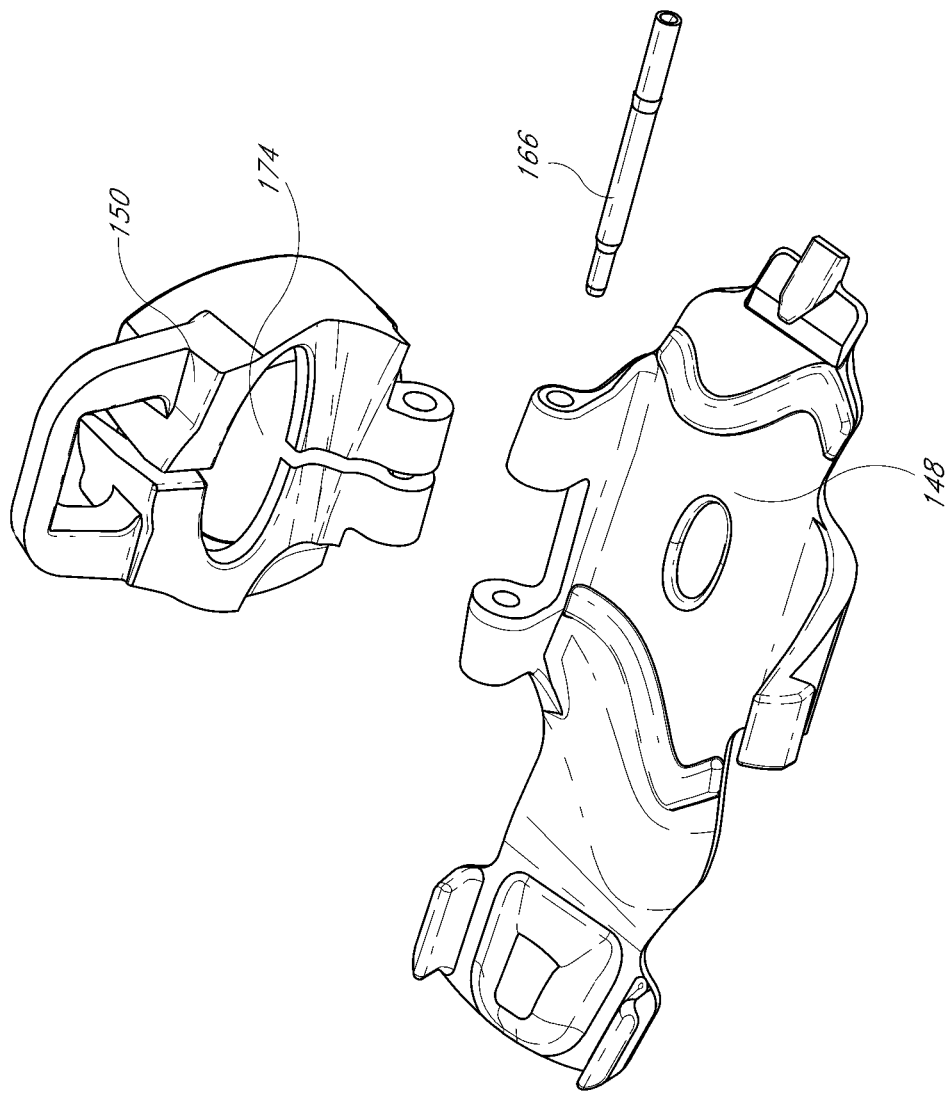
FIGS. 22A-22B show one aspect of the second plate of the detachable module of FIG. 6.
Figure 22B:
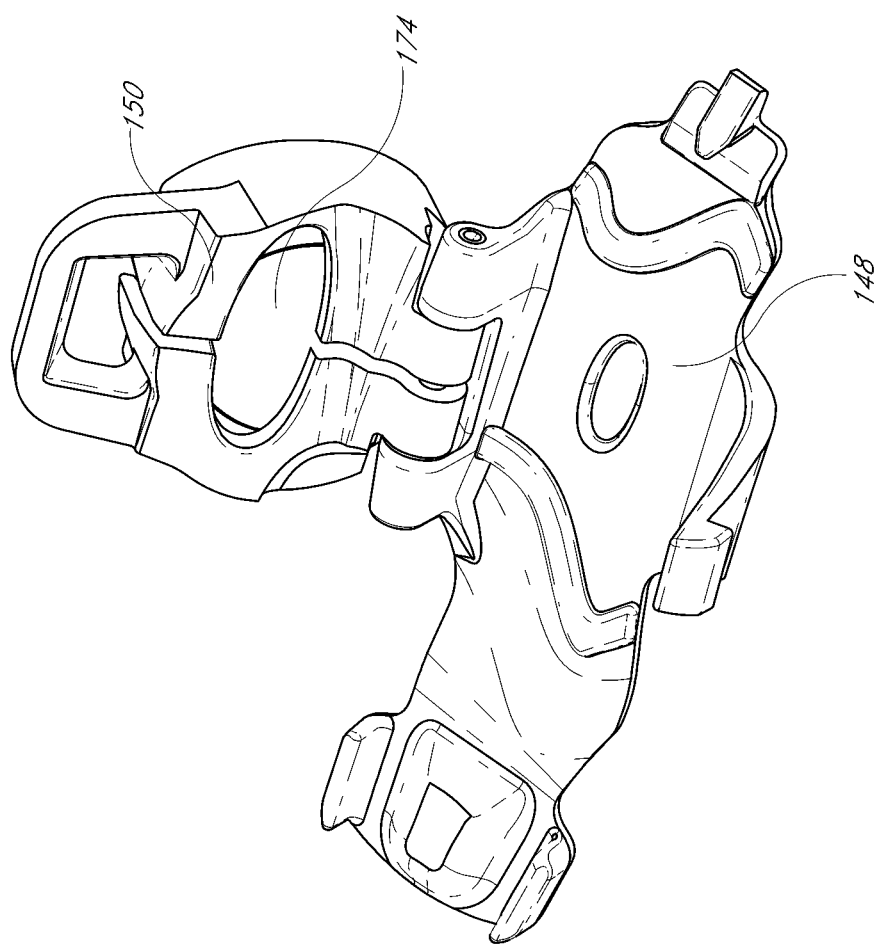

FIGS. 22A and 22B illustrate the first plate 148 and the second plate 150. In an embodiment, an object, for example a pin 166 (e.g., a press-fitted pin, etc.), may not only couple the first plate 148 and the second plate 150, but may also ensure the sheet 174 is secured within the second plate 150. The pin 166 geometry may firmly hold and lock the lips 338 and 340 to prevent them from opening. For example, the pin 166 may be inserted coaxially through the openings in a hinge (e.g., hinge 128) to prevent the lips from moving apart. In addition, this may prevent or reduce the likelihood that the sheet 174 will fall out and/or rattle during use. The pin 166 may be placed to couple the first plate 148 and the second plate 150 without the use of glue or other fasteners (e.g., screws).

The pin 166 can be uniform in diameter. In some embodiments, as described above, the pin 166 has a larger diameter at one end than the other end. For example, the pin 166 can have a larger diameter at the anterior portion 116 of the support member 112 than at the posterior portion of the support member 112.

An operational view of detachable module 104 is illustrated in FIG. 23. As described herein, the pin 166 hingably connects the first plate 148 with the second plate 150. The first plate 148 and/or the second plate 150 may rotate about the longitudinal axis 176. When oriented such that the top lip 154 and the bottom lip 156 are closer in view than the tab 160, the first plate 148 and/or the second plate 150 can rotate clockwise about longitudinal axis 176 until the lip 152 clasps to the second plate 150. When both plates are coupled together via lip 152, the plates can be parallel or substantially parallel with each other. The distance between a portion of the first plate 148 and a portion of the second plate 150 when both are coupled together via lip 152 can be the width of a portion of the support member 112. When oriented such that the top lip 154 and the bottom lip 156 are closer in view than the tab 160, the first plate 148 and/or the second plate 150 can rotate counterclockwise about the longitudinal axis 176 until a top portion of the second plate 150 touches a top portion of the first plate 148. In one embodiment, the first plate 148 and/or the second plate 150 is rotated at least about 5 degrees to release the first coupling 142.

Figure 24:
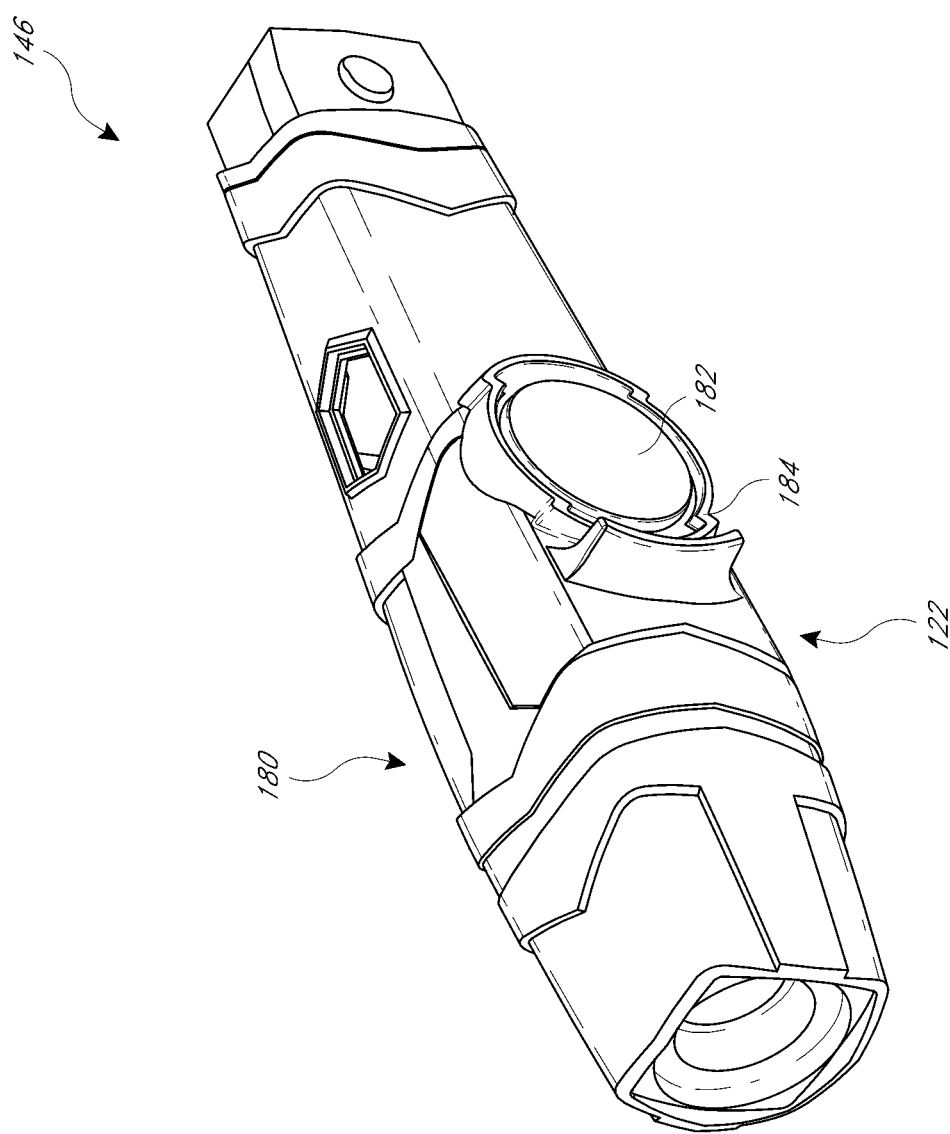
FIG. 24 is a perspective view of a second module in accordance with one embodiment of the present disclosure.
Figure 25:
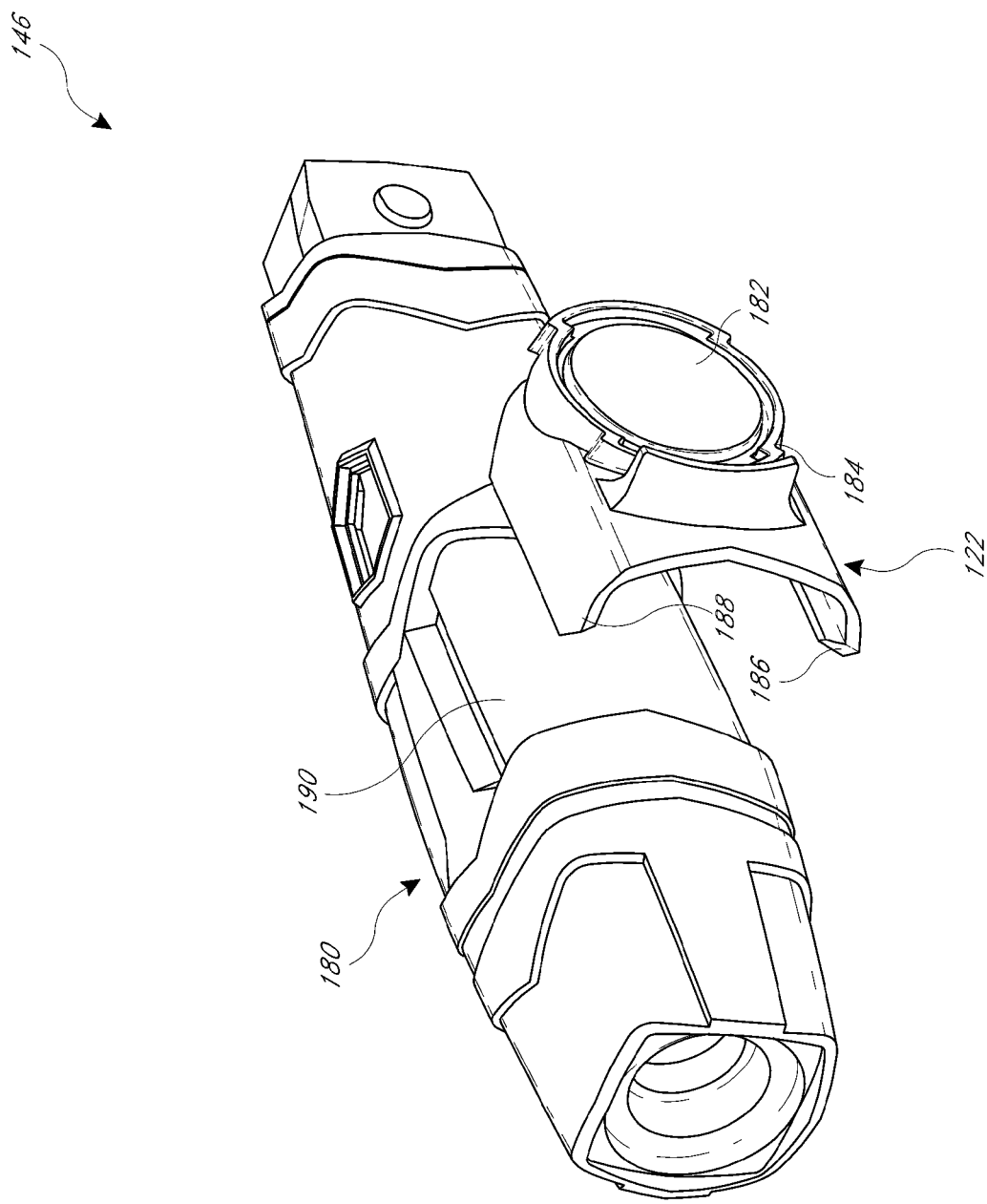
FIG. 25 is another perspective view of the second module of FIG. 24.
Figure 26:
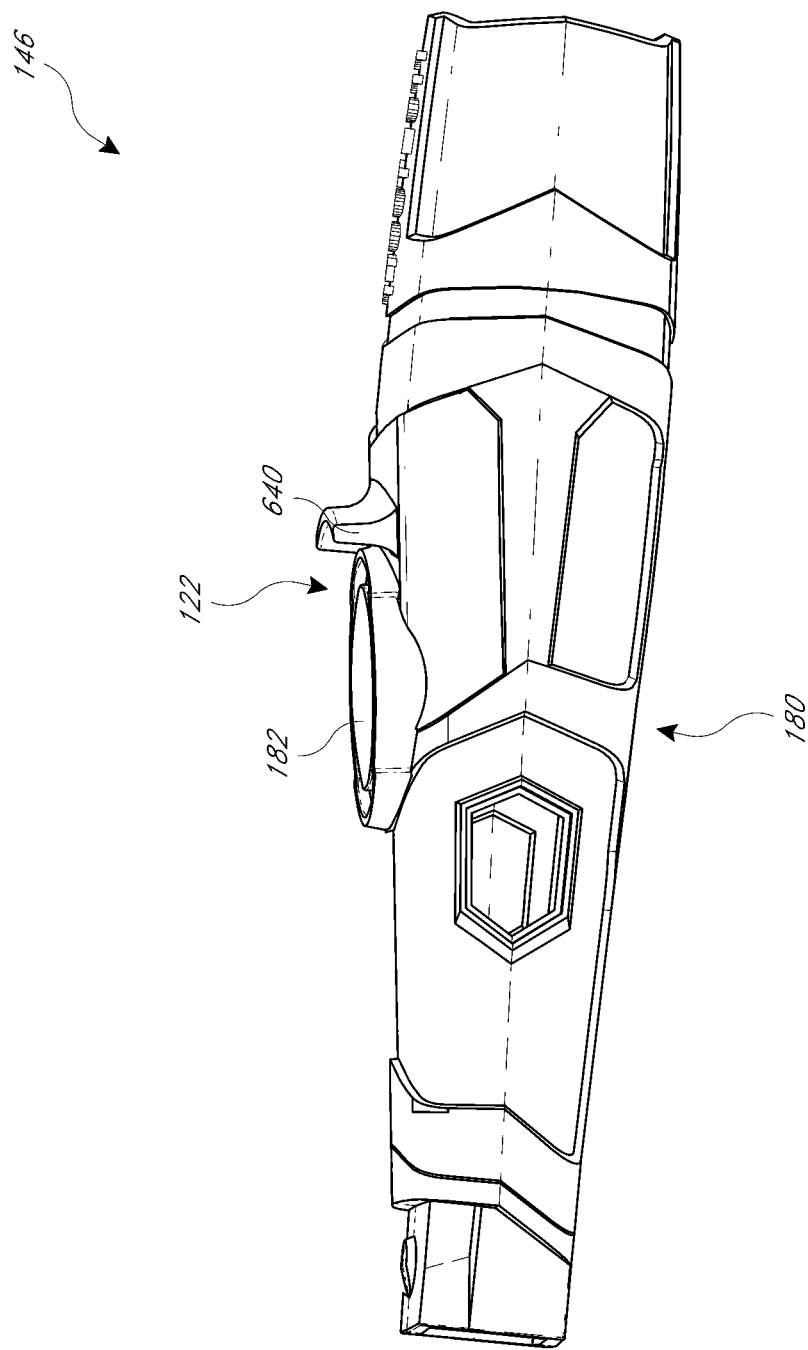
FIG. 26 is a top view of the second module of FIG. 24.

One embodiment of the second module 146 is illustrated in FIGS. 24-26. The second module 146 includes a housing 180 and a connector assembly 122. While FIGS. 24-26 illustrate a housing 180 that resembles a camera, it should be apparent to one skilled in the art that the housing 180 may be designed to be any mountable structure. The housing 180 is formed by attaching at least two body portions along a part line, to provide a protective outer wall which defines at least one interior cavity for housing electronics or mechanical devices. In an embodiment, at least partially inside of the housing 180 can be a power module, an electronics module, a memory module, a data port, and a holder that supports a microphone. The body portions may be made from any of a variety of materials, including plastic or metal. Alternatively, the second module 146 can be formed entirely or partially by insert molding or co-molding processes to produce embedded electronics in a unitary or monolithic module.

The power supply is any of a variety of power structures able to power a second module 146. For example, the power module may include a battery, a capacitor, or other power supply. The power module can be coupled to the electronics module with an adhesive. The electronics module can be coupled to switches which are accessed by the user by pressing one or more buttons (not shown). The switches can include any of a variety of switches known to those of skill in the art, including: micro switches, snap switches, and dome switches. In one embodiment, the switches are snap dome F06180 switches. An LED (not shown) can provide status indication to the wearer.

In an embodiment, the housing 180 supports or includes a microphone and/or a microphone grommet. The microphone grommet can be made from any of a variety of materials well known to those of skill in the art, including: PTFE, polyethylene, polyurethane, or TPE. In addition, the grommet can have a hardness or stiffness of about 20 to 30 durometers, about 40 to 50 durometers, about 60 durometers, or about 70 durometers. A windscreen can be provided with the grommet to reduce noise. The microphone can be any of a variety of microphones known to those of skill in the art.

In other embodiments, at least partially inside of the housing 180 can be a liquid, gas, or solid substance stored in a canister and/or a dispensing mechanism that can eject the substance from the canister.

In an embodiment, the connector assembly 122 includes the coupling device 182 and one or more indentations 184. For example, the coupling device 182 may be a magnet with an opposite polarity as the coupling device 168. In this way, the second module 146 and the detachable module 104 may be removably attached. The one or more indentations 184 may be used to secure and hold the second module 146 in place. In some embodiments, the second module 146 cannot rotate or pivot about an axis through the center of the coupling device 182. For example, the one or more indentations 184 can be complementary to the one or more indentations 164 such that the one or more indentations 184 prevent the second module 146 from rotating. In other embodiments, the second module 146 can rotate or pivot about an axis through the center of the coupling device 182. For example, the one or more indentations 184 can be spaced such that the second module 146 can rotate or pivot to a certain degree about an axis through the center of the coupling device 182. The second module 146 may rotate such that it can be positioned to point parallel to the line of sight of the wearer, to point perpendicular to the line of sight of the wearer, and/or to point in any direction in between. Alternatively, the second module 146 may rotate such that it can point in any direction with no restrictions.

The connector assembly 122 may be coupled to the housing 180 via a mechanical clasp or via an adhesive material. For example, the connector assembly 122 may include tabs 186 and 188 that can fit into at least one complementary insert 190 in housing 180 such that the connector assembly 122 securely snaps to the housing 180. In other embodiments, glue, tape, or any other adhesive material and/or snaps, clips, buttons, or other fastening devices may be used to couple the connector assembly 122 to the housing 180.

The coupling device 182 may include a tab 640. The tab 640 may function to prevent or reduce movement of the housing 180 during use. The tab 640 and its functionality is described in more detail with respect to FIG. 27.

Figure 27:
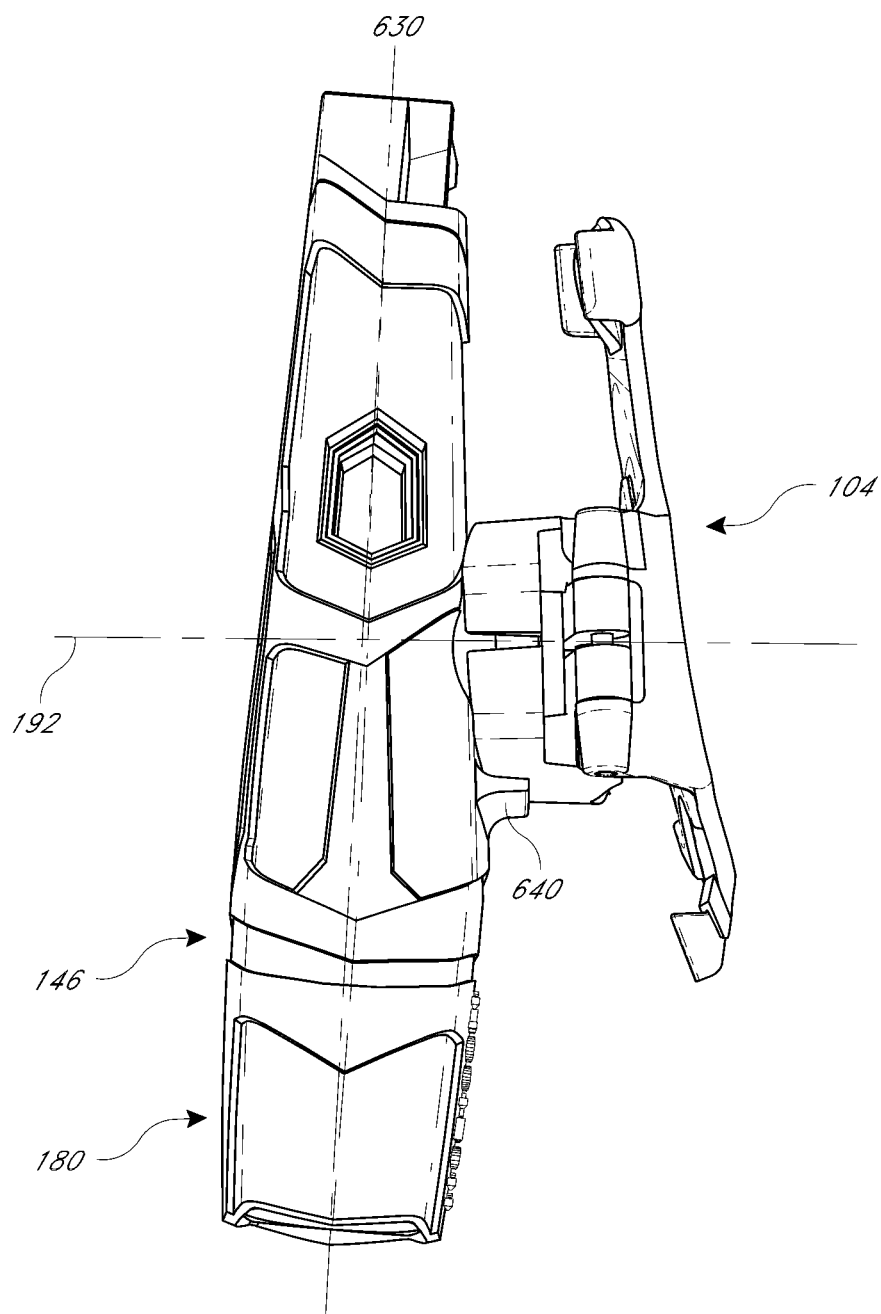
FIG. 27 is a top view of the detachable module of FIG. 6 and the second module of FIG. 24.

One embodiment of the detachable module 104 and the second module 146 is illustrated in FIG. 27. In one implementation, the second module 146 can rotate about an axis 192 through the detachable module 104. For example, the second module 146 may be rotated ±180 degrees. In another implementation, the second module 146 cannot rotate about the axis 192. For example, one or more indentations 184 and/or one or more indentations 172 may prevent the second module 146 from rotating about the axis 192.

The tab 640 may rest against a portion of the second plate 150. In an embodiment, an anterior side of the second module 146 could be an end in which, for example, an opening is placed to allow a camera or other object to point in the direction that a user is facing. As illustrated in FIG. 27, the anterior portion may be the bottom end of the second module 146. In an embodiment, a posterior side of the second module 146 could be an end in which, for example, a cable or wire (not shown) juts out to connect to another device on the person of the user. As illustrated in FIG. 27, the posterior portion may be the top end of the second module 146. In some embodiments, the cable or wire that extends from the posterior end of the second module 146 may be tugged or pulled such that a force is applied to the second module 146 to push the anterior end of the second module 146 towards the user. In other words, a force may be applied to rotate the longitudinal axis 630 that extends in an inferior-superior direction with respect to the second module 146. The tab 640 may couple with the second plate 150 such that the second module 146 remains coupled to the detachable module 104 even when this pressure is applied. In this way, the tab 640 may allow the sheet 174 to stay coupled to the coupling device 168 during movement and operation of the apparatus by a user.

Figure 28:
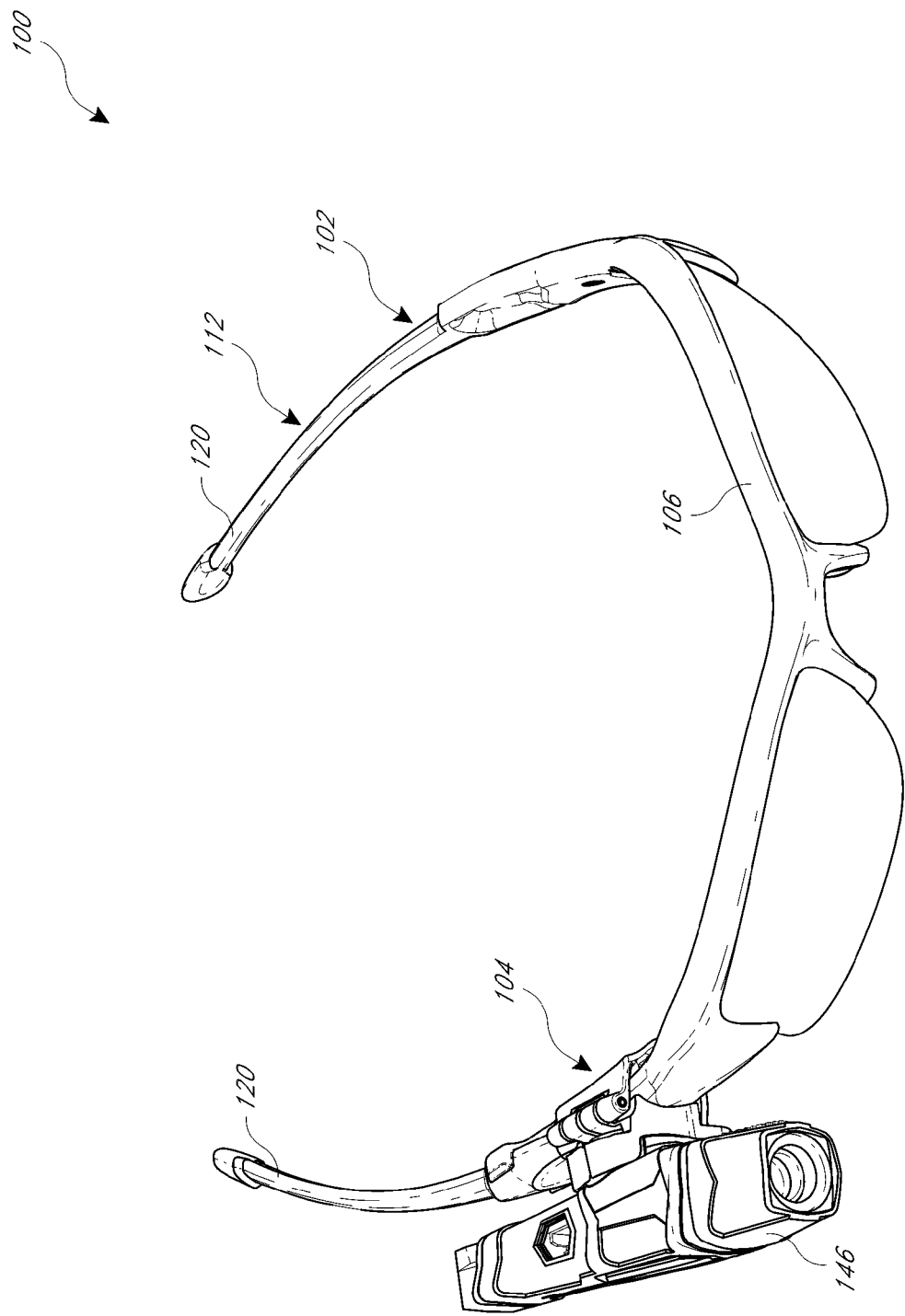
FIG. 28 is a partial side view of the support assembly of FIG. 1, the detachable module of FIG. 6, and the second module of FIG. 24.

One embodiment of the detachable module 104 and the second module 146 attached to the support assembly 100 is illustrated in FIG. 28. In some implementations, the detachable module 104 and the second module 146 may be coupled to a right side of the support assembly 100 as shown. In other implementations, not shown, the detachable module 104 and the second module 146 may be coupled to a left side of the support assembly 100. In still further implementations, not shown, a first detachable module 104 and a first second module 146 may be coupled to a right side of the support assembly 100, and a second detachable module 104 and a second module 146 may be coupled to a left side of the support assembly 100. In any implementation, a detachable module 104 coupled to one support member 112 may be detached and coupled to the other support member 112. The second module 146 may be rotated and/or detached and reattached to point in a direction that corresponds with a line of sight of the wearer.

Figure 29:
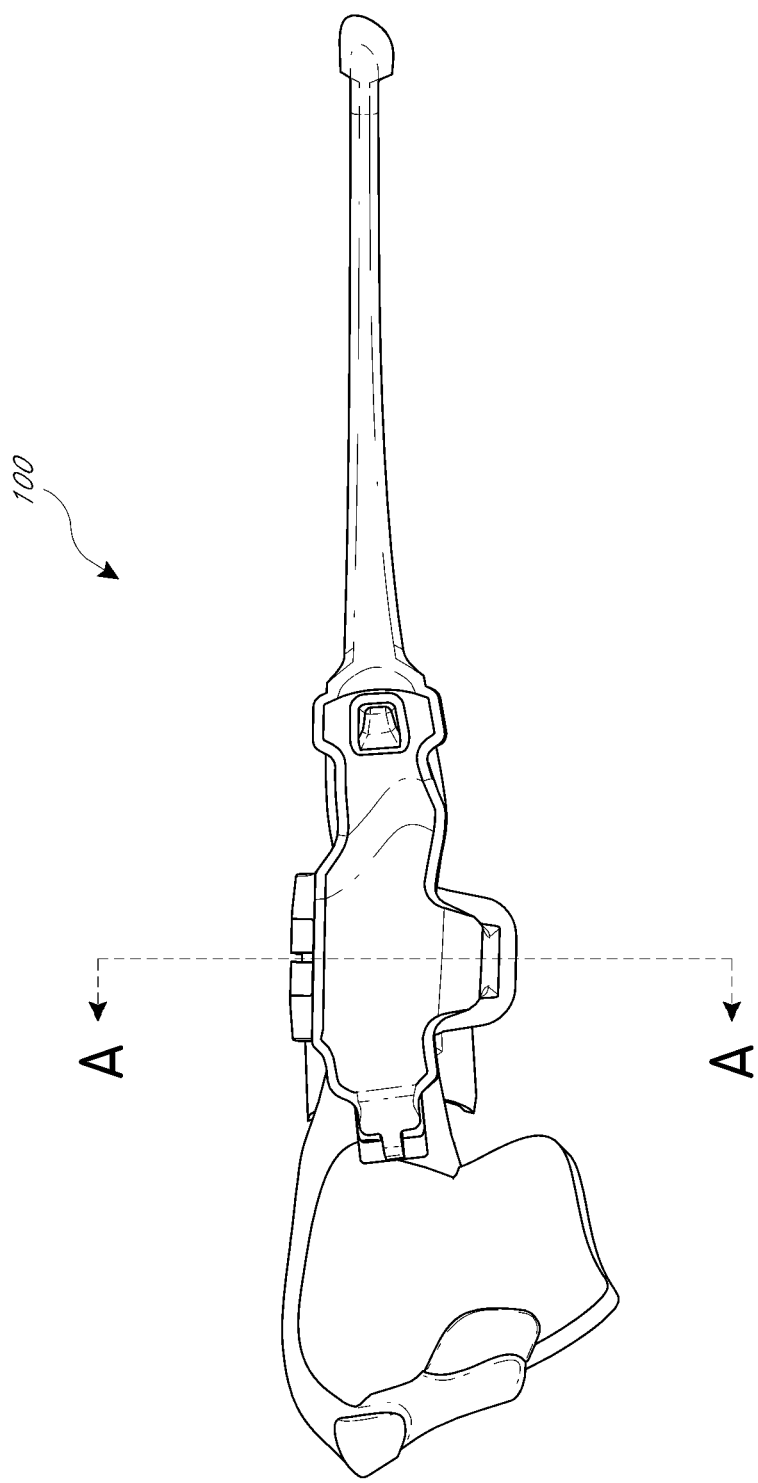
FIG. 29 is an isometric side view of the detachable module and the support assembly of FIG. 4.
Figure 30:
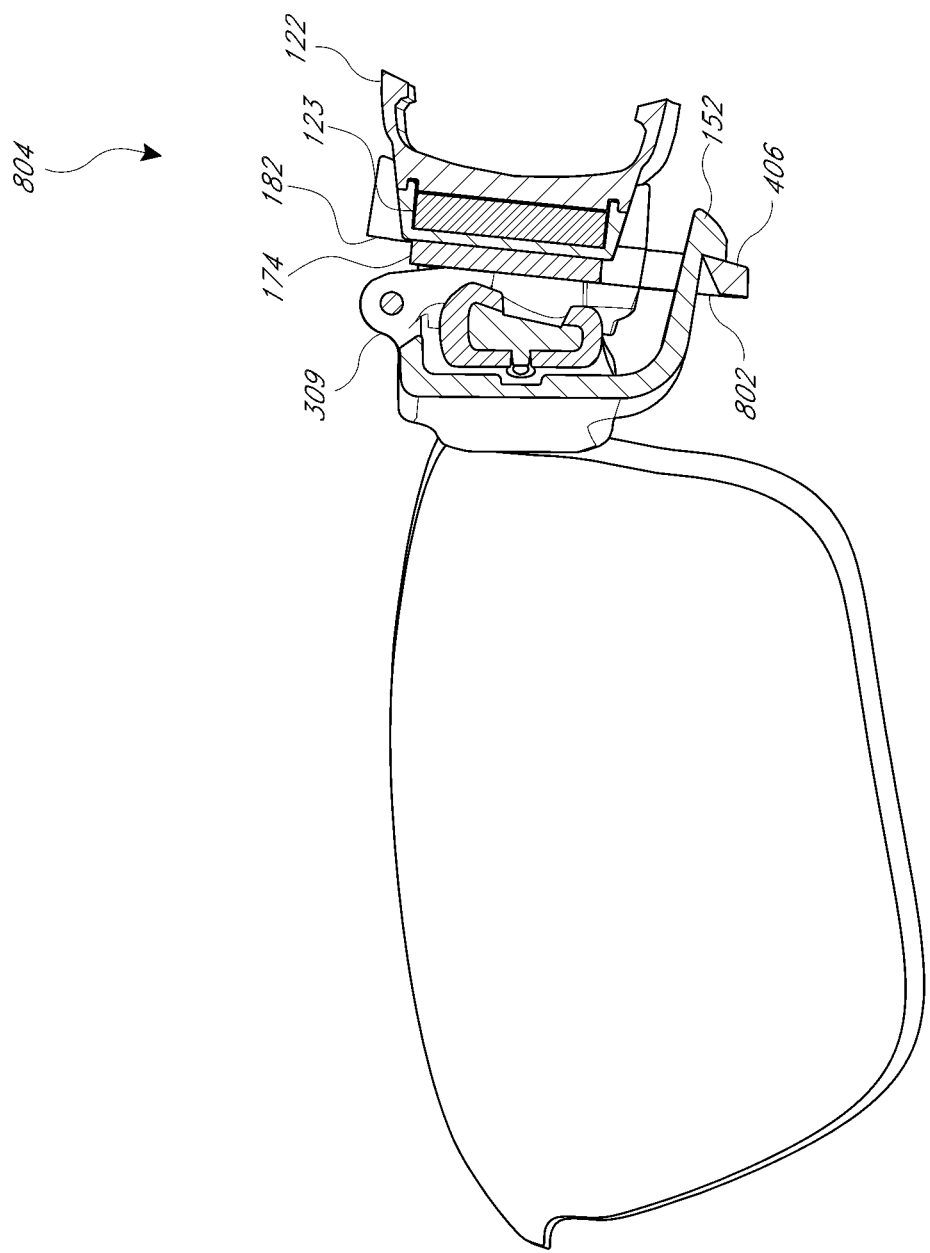
FIG. 30 is a cross section view A-A identified in FIG. 29.

FIG. 29 is an isometric side view of the detachable module 140 and the support assembly 100 of FIG. 4. As illustrated in FIG. 29, the support assembly 100 is shown as fully assembled. A cross-section view A-A of the support assembly 100 and the detachable module 104 is illustrated in FIG. 30. As illustrated in FIG. 30, the plane of the cross-section view A-A longitudinally bisects the slot 434, passing through the center of symmetry of the second plate 150, the sheet 174, and the connector assembly 122.

In an embodiment, the lip 152 includes surface 802 that abuts the surface 406 when the first plate 148 and the second plate 150 are in the closed position. The sheet 174 in the assembled configuration of the second plate 150, as shown in FIGS. 4, 5, and 30, is held in a pocket 804 of the interior 410. The rear face 1204 of the sheet 174 may face or abut surfaces 412 and/or 414 and/or symmetrically arranged surfaces of the right portion 404. The front face 1222 of the sheet 174 may face or abut the surface 516 and/or a symmetrically arranged surface of the right portion 404. To arrive at its operative position inside the pocket 804, the slot 434 may be enlarged by spreading the barrels 309 and 311 apart slightly against tension provided by the first coupling 142 so that the left portion 402 moves away from the right portion 404. In the spread apart configuration, a cord of the circular interior 410 may exceed a diameter of the sheet 174, facilitating passage of the sheet 174 into the pocket 804. After the diameter of the sheet 174 intersects a center of the interior 410, the barrels 309 and 311 may return toward their original positions to relax some or all of the tension of the first coupling 142.

In an embodiment, when the barrels 309 and 311 are placed between the barrels 310 and 312, as indicated in FIG. 12, the slot 434 may not be enlarged. Consequently, the sheet 174 may be held (e.g., positioned, supported, confined, etc.) in the pocket 804 at least in part by the cooperation of the barrels 309, 310, 311, and 312 and the pin 166. The sheet 174 may be held by the second plate 150 in part by residual tension in the first coupling 142.

Figure 31:
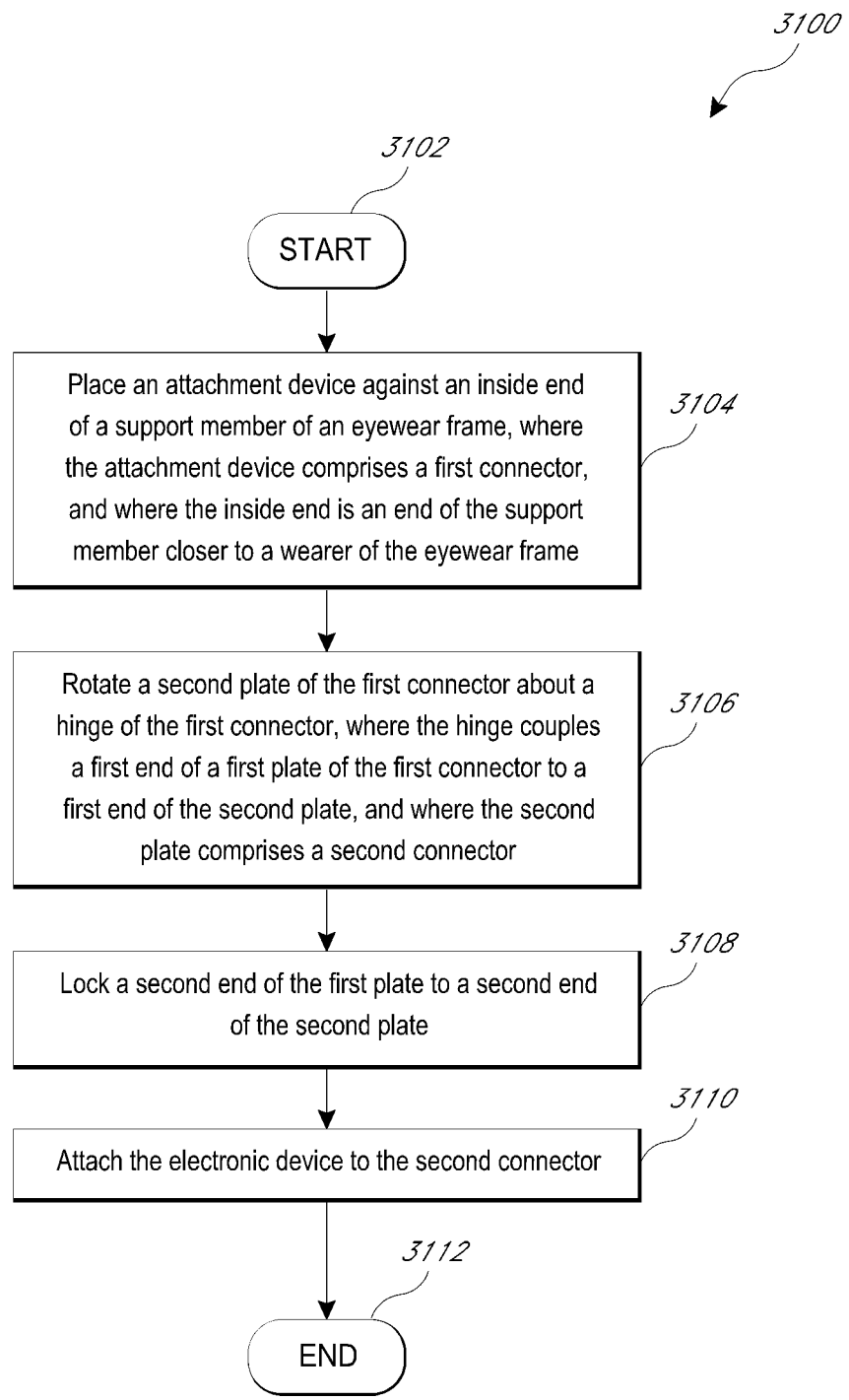
FIG. 31 is one embodiment of a method for removably coupling an electronic device to eyewear.

One method 3100 for removably coupling an electronic device to eyewear is shown in the flowchart of FIG. 31. The method 3100 begins at block 3102. At block 3104, an attachment device is placed against an inside end of a support member of an eyewear frame. In an embodiment, the attachment device includes a first connector and the inside end is an end of the support member closer to a wearer of the eyewear frame.

At block 3106, a second plate of the first connector is rotated about a hinge of the first connector. In an embodiment, the hinge couples a first end of a first plate of the first connector to a first end of the second plate and the second plate includes a second connector.

At block 3108, a second end of the first plate is locked to a second end of the second plate. At block 3110, an electronic device is attached to the second connector. At block 3112, the method 3100 ends.

Figure 32:
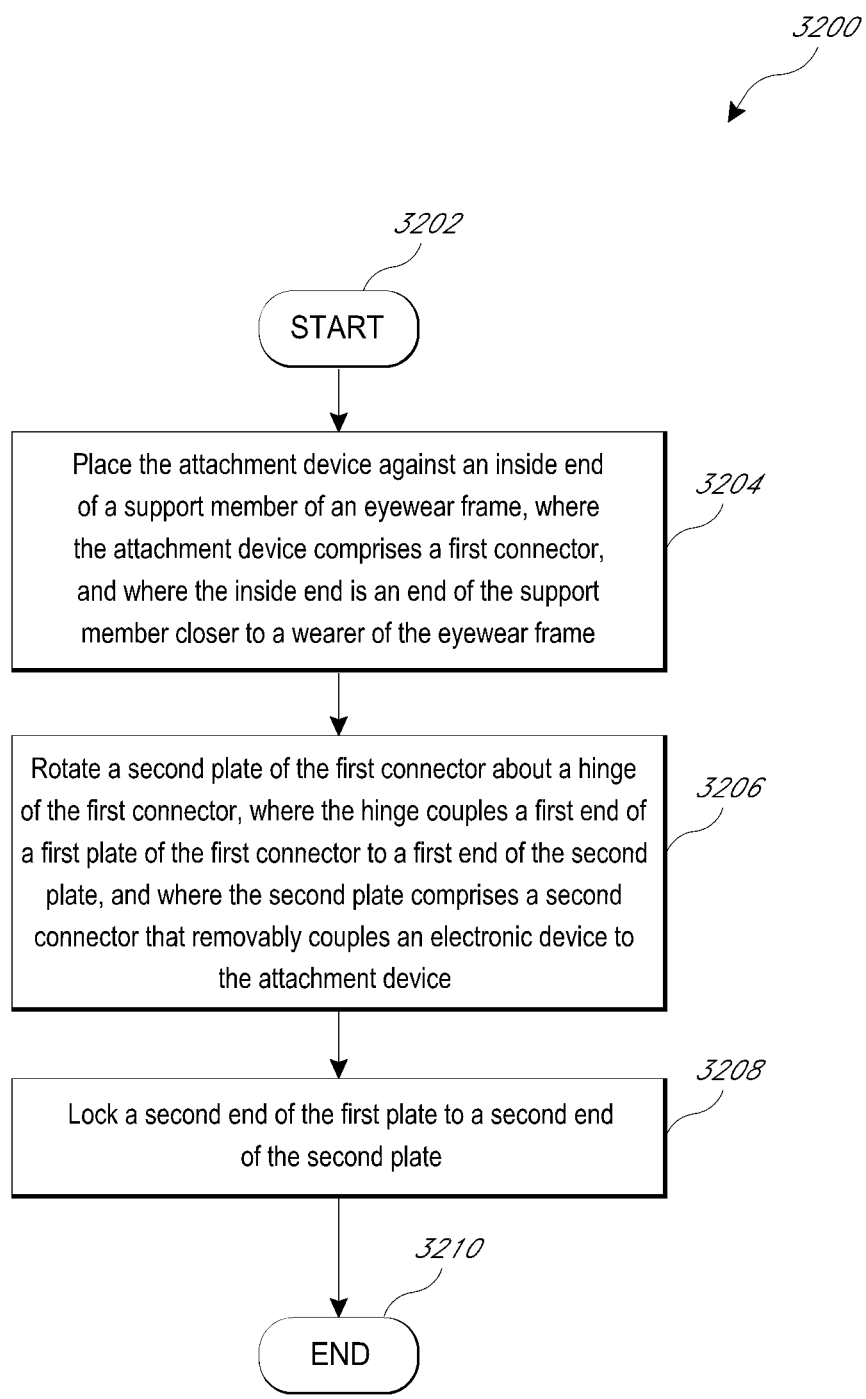
FIG. 32 is one embodiment of a method for removably coupling an attachment device to eyewear.

One method 3200 for removably coupling an attachment device to eyewear is shown in the flowchart of FIG. 32. The method begins at block 3202. At block 3204, an attachment device is placed against an inside end of a support member of an eyewear frame. In an embodiment, the attachment device includes a first connector and the inside end is an end of the support member closer to a wearer of the eyewear frame.

At block 3206, a second plate of the first connector is rotated about a hinge of the first connector. In an embodiment, the hinge couples a first end of a first plate of the first connector to a first end of the second plate and the second plate includes a second connector that removably couples an electronic device to the attachment device.

At block 3208, a second end of the first plate is locked to a second end of the second plate. At block 3210, the method 3200 ends.

Although this invention has been disclosed in the context of a certain preferred embodiments, it will be understood by those skilled in the art that the present invention extends beyond the specifically disclosed embodiment to other alternative embodiments and/or uses of the invention and obvious modifications and equivalents thereof. In particular, while the present support assembly, support, detachable module, second module, and methods have been described in the context of a particularly preferred embodiment, the skilled artisan will appreciate, in view of the present disclosure, that certain advantages, features and aspects of the support assembly, support, detachable module, second module, and method may be realized in a variety of other devices. Additionally, it is contemplated that various aspects and features of the invention described can be practiced separately, combined together, or substituted for one another, and that a variety of combination and sub-combinations of the features and aspects can be made and still fall within the scope of the disclosure. Thus, it is intended that the scope of the present disclosure herein disclosed should not be limited by the particular disclosed embodiment described above, but should be determined only by a fair reading of the claims that follow.

What is claimed is:

1. A dual attachment member configured to removably couple an electronic device to an eyewear having electronics, the eyewear configured to receive data from the electronic device, the dual attachment member comprising:
an attachment device configured to support the electronic device on the eyewear, the attachment device comprising:
a first connector configured to removably couple the attachment device to the eyewear, the first connector comprising an interlocking member configured to hold the first connector in place relative to the eyewear, the interlocking member comprising a first protrusion configured to be inserted into a cavity of the eyewear; and
a second connector configured to removably couple the attachment device to the electronic device, the second connector configured to inhibit rotation of the electronic device relative to the second connector;
wherein the attachment device coupled to the eyewear and the electronic device is configured to provide a data connection between the electronic device and the eyewear such that the electronic device can transmit data to the eyewear and the eyewear can receive data from the electronic device via the attachment device.

2. The combination of the dual attachment member of claim 1 and the eyewear.

3. The combination of the dual attachment member of claim 1 and the electronic device.

4. The dual attachment member of claim 1, wherein the attachment device further comprises circuitry extending between the first connector and the second connector.

5. The dual attachment member of claim 1, wherein the electronic device comprises a radio frequency transceiver for wirelessly communicating with a remote device.

6. The dual attachment member of claim 1, wherein the eyewear comprises an audio device.

7. The dual attachment member of claim 1, wherein the electronic device is an audio-video module.

8. The dual attachment member of claim 1, wherein the first protrusion is a tab configured to be inserted into the cavity of the eyewear.

9. The dual attachment member of claim 1, wherein the second connector comprises a keyed feature for coupling with a correspondingly keyed feature on the electronic device, wherein the keyed feature is configured to inhibit rotation of the electronic device relative to the second connector.

10. The dual attachment member of claim 9, wherein the attachment device further comprises a first portion and a second portion rotatably coupled via a hinge, the first portion comprising the interlocking member and the second portion comprising the keyed feature.

11. The dual attachment member of claim 1, wherein the interlocking member is non-circular.

12. A dual attachment member configured to removably couple an electronic device to a headwear apparatus, the headwear apparatus having one or more interlocking structures sized and shaped to interface with at least a portion of the dual attachment member, at least one of the interlocking structures comprising a cavity configured to receive a portion of the dual attachment member, the dual attachment member comprising:
an attachment device comprising a first connector configured to removably couple the attachment device to the headwear apparatus and a second connector configured to removably couple the attachment device to the electronic device, the first connector comprising:
a first plate configured to contact an inner surface of the headwear apparatus when the attachment device is removably coupled to the headwear apparatus, the first plate comprising one or more interlocking members, wherein:
the one or more interlocking members are configured to interface with the one or more interlocking structures of the headwear apparatus when the attachment device is attached to the headwear apparatus such that the attachment device is positioned at a pre-defined location on the headwear apparatus upon coupling the attachment device to the headwear apparatus; and
the one or more interlocking members comprise at least one protrusion configured to inhibit rotation of the first connector about an axis of rotation generally orthogonal to the inner surface, the protrusion being positioned on at least one of an anterior and a posterior end of the first plate; and
a second plate configured to contact an outer surface of the headwear apparatus when the attachment device is removably coupled to the headwear apparatus, the second plate comprising the second connector;
wherein a first end of the first plate is coupled to a first end of the second plate;
wherein the electronic device points in a pre-defined direction that is generally aligned with the path of the field of view of the wearer upon coupling the attachment device to the headwear apparatus and the electronic device.

13. The combination of the dual attachment member of claim 12 and the headwear apparatus.

14. The combination of the dual attachment member of claim 12 and the electronic device.

15. The dual attachment member of claim 12, wherein the electronic device is configured to capture images in the line of sight of the wearer.

16. The dual attachment member of claim 15, wherein the electronic device is a camera comprising a battery, memory, and a microphone.

17. The dual attachment member of claim 12, wherein the attachment device is configured to provide at least one of an electrical connection or a data connection between the electronic device and the headwear apparatus.

18. The dual attachment member of claim 12, wherein a second end of the first plate is removably coupled to a second end of the second plate.

19. The dual attachment member of claim 12, wherein the second connector comprises a magnet.

20. The dual attachment member of claim 12, wherein the attachment device comprises a hinge, wherein the first end of the first plate is coupled to the first end of the second plate via the hinge.

21. The dual attachment member of claim 12, wherein the protrusion comprises a first lip configured to contact a third surface of the headwear apparatus and a second lip configured to contact a fourth surface of the headwear apparatus when the attachment device is removably coupled to the headwear apparatus, the third and fourth surfaces being generally orthogonal to the first surface.

22. The dual attachment member of claim 12, wherein the dual attachment member comprises a connector assembly comprising a first connector configured to couple the connector assembly to the electronic device and a second connector, wherein the second connector of the connector assembly is configured to cooperate with the second connector of the attachment device to removably couple the connector assembly to the attachment device.

23. The dual attachment member of claim 22, wherein the first connector of the connector assembly is configured to removably couple the connector assembly to the electronic device.

24. The dual attachment member of claim 22, wherein the second connector of the connector assembly comprises indentations to inhibit rotation of the connector assembly when removably coupled to the second connector of the attachment device.

25. The dual attachment member of claim 12, wherein the headwear apparatus is an eyeglass frame.

26. The dual attachment member of claim 12, wherein:
at least one of the interlocking structures of the headwear apparatus is a cavity; and
at least one of the interlocking members of the first plate is a tab configured to be inserted into the cavity upon coupling the attachment device to the headwear apparatus;
the tab is configured to be inserted into the cavity.

27. The dual attachment member of claim 12, wherein:
at least one of the interlocking structures of the headwear apparatus is an indentation; and
at least one of the interlocking members of the first plate is a complementary indentation having a size and shape configured to rest against the indentation of the headwear apparatus upon coupling the attachment device to the headwear apparatus.

28. A dual attachment member configured to removably couple an electronic device to an eyewear having electronics, the eyewear configured to receive data from the electronic device, the dual attachment member comprising:
an attachment device configured to support the electronic device on the eyewear, the attachment device comprising:
a first portion comprising a first connector configured to removably couple the attachment device to the eyewear, the first connector comprising a first interlocking member configured to be inserted into a cavity of the eyewear to hold the first connector in place relative to the eyewear, wherein the interlocking member and cavity are configured to interface to inhibit rotation of the interlocking member relative to the eyewear; and
a second portion comprising a second connector configured to removably couple the attachment device to the electronic device, the second connector comprising a keyed feature for coupling with a correspondingly keyed feature on the electronic device, wherein the keyed features of the second connector and the electronic device are configured to interface to inhibit rotation of the electronic device relative to the keyed feature;
a hinge configured to allow the first portion and the second portion of the attachment device to be rotated relative to each other;
wherein the attachment device coupled to the eyewear and the electronic device is configured to provide a data connection between the electronic device and the eyewear such that the electronic device can transmit data to the eyewear and the eyewear can receive data from the electronic device via the attachment device.

29. The dual attachment member of claim 28, wherein the interlocking member comprises a first protrusion configured to be inserted into the cavity of the eyewear.

30. The dual attachment member of claim 28, wherein:
the keyed feature of the second connector comprises a housing with at least one indentation; and
the keyed feature of the electronic device comprises a second coupling comprising one or more complementary indentations, the second coupling sized and shaped to mechanically lock into place in the housing.

* * * * *